United States Patent
Oh et al.

(10) Patent No.: US 8,773,939 B2
(45) Date of Patent: Jul. 8, 2014

(54) STACKED MEMORY DEVICES WITH MICRO CHANNELS AND MEMORY SYSTEMS INCLUDING THE SAME

(75) Inventors: Tae-Young Oh, Seoul (KR); Kwang-il Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 98 days.

(21) Appl. No.: 13/462,338

(22) Filed: May 2, 2012

(65) Prior Publication Data

US 2012/0294059 A1 Nov. 22, 2012

(30) Foreign Application Priority Data

May 16, 2011 (KR) .................. 10-2011-0045805

(51) Int. Cl.
*G11C 8/00* (2006.01)

(52) U.S. Cl.
USPC ................ 365/230.03; 365/63; 365/189.02; 365/189.17

(58) Field of Classification Search
USPC ............... 365/63, 189.02, 189.17, 230.03
See application file for complete search history.

(56) References Cited

U.S. PATENT DOCUMENTS

| 6,169,688 | B1 | 1/2001 | Noguchi |
| 7,763,496 | B2 | 7/2010 | Ikeda et al. |
| 2007/0007609 | A1 | 1/2007 | Saito et al. |
| 2009/0244960 | A1 | 10/2009 | Saito et al. |
| 2010/0046266 | A1 | 2/2010 | Bruennert et al. |
| 2010/0088460 | A1 | 4/2010 | Jeddeloh |
| 2010/0121994 | A1 | 5/2010 | Kim et al. |
| 2010/0172172 | A1 | 7/2010 | Kim et al. |
| 2010/0219492 | A1 | 9/2010 | Roiz Wilson |
| 2010/0226657 | A1* | 9/2010 | Raymond et al. ............. 398/141 |

FOREIGN PATENT DOCUMENTS

| JP | 2000-357829 A | 12/2000 |
| JP | 2006-352147 A | 12/2006 |
| JP | 2007019179 A | 1/2007 |
| KR | 2010-0052394 A | 5/2010 |
| KR | 2010-0081087 A | 7/2010 |

* cited by examiner

*Primary Examiner* — Hoai V Ho
(74) *Attorney, Agent, or Firm* — Harness, Dickey & Pierce, P.L.C.

(57) ABSTRACT

At least one example embodiment discloses a stacked memory device including a plurality of stacked memory chips, each of the memory chips including a memory array, a plurality of through silicon vias (TSVs) operatively connected to the plurality of stacked memory chips, micro channels configured to access the memory arrays and at least one circuit in each memory chip, the at least one circuit configured to vary a number of the micro channels accessing the memory array.

20 Claims, 18 Drawing Sheets

STACKED MEMORY DEVICES WITH MICRO CHANNELS AND MEMORY SYSTEMS INCLUDING THE SAME

CROSS-REFERENCE TO RELATED APPLICATION

This application claims priority under 35 U.S.C. §119 to Korean Patent Application No. 10-2011-0045805 filed on May 16, 2011, the entire contents of which are hereby incorporated by reference.

BACKGROUND

1. Field

Example embodiments of inventive concepts relate to semiconductor memory devices, and more particularly, to a stacked semiconductor memory device in which a plurality of memory chips are three-dimensionally stacked and a memory system including the same.

2. Description of Related Art

Stacked semiconductor memory devices in which memory chips are three-dimensionally stacked using through silicon vias (TSVs) for ultra-high speed communication between semiconductor integrated circuits as a means of communication are being studied.

SUMMARY

Example embodiments of inventive concepts provide a stacked memory device capable of varying the number of micro channels for accessing a memory array included in each of the memory chips.

Example embodiments of inventive concepts also provide a memory system including the stacked memory device.

The technical objectives of inventive concepts are not limited to the above disclosure; other objectives may become apparent to those of ordinary skill in the art based on the following descriptions.

In accordance with an aspect of inventive concepts, a stacked memory device includes a plurality of stacked memory chips, each of the memory chips including a memory array, a plurality of through silicon vias (TSVs) operatively connected to the plurality of stacked memory chips; micro channels configured to access the memory arrays, and at least one circuit in each memory chip configured to vary a number of the micro channels accessing the memory array.

In some example embodiments, the micro channels may include the plurality of TSVs.

In some example embodiments, memory capacity accessed by each of the micro channels may vary.

In some example embodiments, a number of memory banks accessed by each of the micro channels may vary.

In some example embodiments, each of the plurality of memory chips includes a plurality of the at least one circuit. Each of the at least one circuit includes a first sub memory array, a second sub memory array, and an input/output buffer circuit.

The input/output buffer circuit is configured to select at least one micro channel in response to a selecting code, the input/output buffer circuit is configured to receive input data through the at least one selected micro channel and input to at least one of the first sub memory array and the second sub memory array. The input/output buffer circuit is configured to output data from at least one of the first sub memory array and the second sub memory array through the at least one selected micro channel.

In some example embodiments, the input/output buffer circuit may include a first buffer circuit and a second buffer circuit.

The first buffer circuit is configured to receive a first address, a first command and first input data through a first micro channel in response to the selecting code, and input the first input data to at least one of the first sub memory array and the second sub memory array based on the first address and the first command, or output a first output data from at least one of the first sub memory array and the second sub memory array through the first micro channel. The second buffer circuit is configured to receive a second address, a second command and second input data through a second micro channel in response to the selecting code, and input the second input data to at least one of the first sub memory array and the second sub memory array based on the second address and the second command, or output second output data from at least one of the first sub memory array and the second sub memory array through the second micro channel.

In some example embodiments, the first buffer circuit may include a first address/command input circuit, a first address/command decoder, a first data input/output circuit, and a first multiplexer.

The first address/command input circuit receives the first address, the first command and the first input data through the first micro channel. The first address/command decoder is configured to decode the first address and the first command in response to the selecting code. The first data input/output circuit is configured to receive the first input data, or output the first output data in response to the decoded first address and the decoded first command. The first multiplexer is configured to input the first input data to at least one of the first sub memory array and the second sub memory array in response to the decoded first address and the decoded first command, or receive the first output data from at least one of the first sub memory array and the second sub memory array to provide to the first data input/output circuit.

In some example embodiments, the second buffer circuit may include a second address/command input circuit, a second address/command decoder, a second data input/output circuit, and a second multiplexer.

The second address/command input circuit is configured to receive the second address, the second command and the second input data through the second micro channel. The second address/command decoder is configured to decode the second address and the second command in response to the selecting code. The second data input/output circuit is configured to receive the second input data, or output the second output data in response to the decoded second address and the decoded second command. The second multiplexer is configured to input the second input data to at least one of the first sub memory array and the second sub memory array in response to the decoded second address and the decoded second command, or receive the second output data from at least one of the first sub memory array and the second sub memory array to provide to the second data input/output circuit.

In some example embodiments, the second buffer circuit may include a second address/command input circuit, a second address/command decoder, a second multiplexer, a second data input/output circuit, and a third multiplexer.

The second address/command input circuit is configured to receive the second address, the second command and the second input data through the second micro channel. The second address/command decoder is configured to decode the second address and the second command in response to the selecting code. The second multiplexer is configured to select one of an output signal of the first address/command decoder and an output signal of the second address/command decoder in response to the selecting code. The second data input/output circuit is configured to operate in response to the selecting code, and receives the second input data or output the second output data in response to an output signal of the second multiplexer. The third multiplexer is configured to input the second input data to at least one of the first sub memory array and the second sub memory array in response to the output signal of the second multiplexer, or receive the second output data from the first sub memory array and/or the second sub memory array to provide to the second data input/output circuit.

In some example embodiments, the stacked memory device may include a first memory chip, a second memory chip stacked above the first memory chip, a third memory chip stacked above the second memory chip, and a fourth memory chip stacked above the third memory chip.

The fourth memory chip is accessed by a first micro channel, a fifth micro channel, a ninth micro channel, and a thirteenth micro channel. The third memory chip is accessed by a second micro channel, a sixth micro channel, a tenth micro channel, and a fourteenth micro channel. The second memory chip is accessed by a third micro channel, a seventh micro channel, an eleventh micro channel, and a fifteenth micro channel. The first memory chip is accessed by a fourth micro channel, an eighth micro channel, a twelfth micro channel, and sixteenth micro channel.

In some example embodiments, the stacked memory device may include a first memory chip and a second memory chip stacked above the first memory chip.

The second memory chip is accessed by a first micro channel, a third micro channel, a fifth micro channel, a seventh micro channel, a ninth micro channel, an eleventh micro channel, a thirteenth micro channel, and a fifteenth micro channel. The first memory chip is accessed by a second micro channel, a fourth micro channel, a sixth micro channel, an eighth micro channel, a tenth micro channel, a twelfth micro channel, a fourteenth micro channel, and a sixteenth micro channel.

In some example embodiments, the second memory chip may include a first circuit, a second circuit, a third circuit and a fourth circuit.

The first circuit may include first memory banks accessed by the first micro channel, and second memory banks accessed by the third micro channel. The second circuit may include third memory banks accessed by the fifth micro channel, and fourth memory banks accessed by the seventh micro channel. The third circuit may include fifth memory banks accessed by the ninth micro channel, and sixth memory banks accessed by the eleventh micro channel. The fourth circuit may include seventh memory banks accessed by the thirteenth micro channel, and eighth memory banks accessed by the fifteenth micro channel.

In some example embodiments, each of the plurality of memory chips may be comprised of a plurality of circuits. Each of the circuits may include a first sub memory array, a second sub memory array, and an input/output buffer circuit.

The input/output buffer circuit is configured to select at least one micro channel through which the circuits are accessed in response to a laser fuse output signal, an anti-fuse output signal or an input signal from outside of a memory chip, and receive input data through the selected at least one micro channel to input to the first sub memory array and/or the second sub memory array. The input/output buffer circuit is configured to output data from the first sub memory array and/or the second sub memory array through the selected micro channel or selected micro channels.

In some example embodiments, the input/output buffer circuit may include a first buffer circuit and a second buffer circuit.

The first buffer circuit is configured to receive a first address, a first command and first input data through a first micro channel in response to the laser fuse output signal, the anti-fuse output signal or the input signal from outside of the memory chip, and input the first input data to at least one of the first sub memory array and the second sub memory array based on the first address and the first command, or output a first output data from at least one of the first sub memory array and the second sub memory array through the first micro channel. The second buffer circuit is configured to receive a second address, a second command and second input data through a second micro channel in response to the selecting code, and input the second input data to at least one of the first sub memory array and the second sub memory array based on the second address and the second command, or output a second output data from at least one of the first sub memory array and the second sub memory array through the second micro channel.

In some example embodiments, the stacked memory device may include a master chip including an input/output buffer circuit, and at least one slave chip including a memory array and stacked above the master chip.

In some example embodiments, the input/output buffer circuit is configured to select at least one micro channel in the memory array included in each of the at least one slave chip in response to a selecting code, and the input/output buffer is configured to transfer an address, a command and input data to each of the at least one slave chip through the selected at least one micro channel. Further, the input/output buffer circuit is configured to output data from the memory array included in each of the at least one slave chip through the selected at least one micro channel.

In accordance with another aspect of inventive concepts, a memory system includes a memory controller and a stacked memory device.

The memory controller is configured to generate an address and a command. The stacked memory device is configured to operate based on the address and the command, and includes a plurality of stacked memory chips. A number of micro channels for accessing a memory array included in each of the plurality of stacked memory chips may vary.

At least one example embodiment discloses a memory system including a plurality of memory chips, each of the plurality of memory chips including, a plurality of circuit blocks, each circuit block being coupled to a plurality of micro channels, each micro channel coupled to the plurality of memory chips, each circuit block including, a first memory array configured to store information based on data received from at least one of the plurality of micro channels.

BRIEF DESCRIPTION OF THE DRAWINGS

The foregoing and other features and advantages of inventive concepts will be apparent from the more particular description of example embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF EXAMPLE EMBODIMENTS

Figure 1:
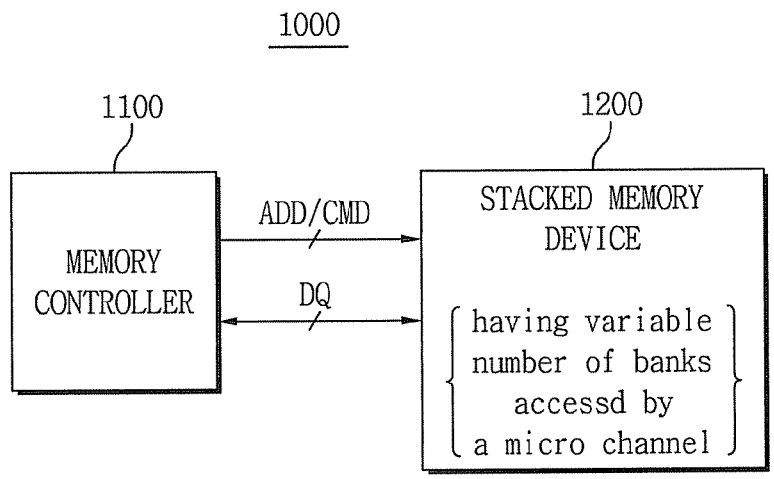
FIG. 1 is a block diagram showing a memory system including a stacked memory device in accordance with an example embodiment of inventive concepts.

Various example embodiments will now be described more fully with reference to the accompanying drawings in which some example embodiments are shown. Inventive concepts may, however, be embodied in different forms and should not be construed as limited to the embodiments set forth herein. Rather, example embodiments are provided so that this disclosure is thorough and complete and fully conveys inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of inventive concepts. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of inventive concepts will now be described with reference to the accompanying drawings.

FIG. 1 is a block diagram showing a memory system including a stacked memory device in accordance with an example embodiment of inventive concepts.

Referring to FIG. 1, the memory system 1000 includes a memory controller 1100 and a stacked memory device 1200.

The memory controller 1100 generates an address ADD and a command CMD, and transmits data DQ to the stacked memory device 1200, or receives data DQ from the stacked memory device 1200. The stacked memory device 1200 operates based on the address ADD and the command CMD, and comprises a plurality of stacked memory chips. A number of micro channels for accessing a memory array included in each of the plurality of stacked memory chips may vary. Each of the micro channels may include a plurality of through-silicon-vias (TSVs).

In the stacked memory device 1200, memory capacity accessed by each of the micro channels may vary. Further, the number of memory banks accessed by each of the micro channels may vary.

Figure 2:
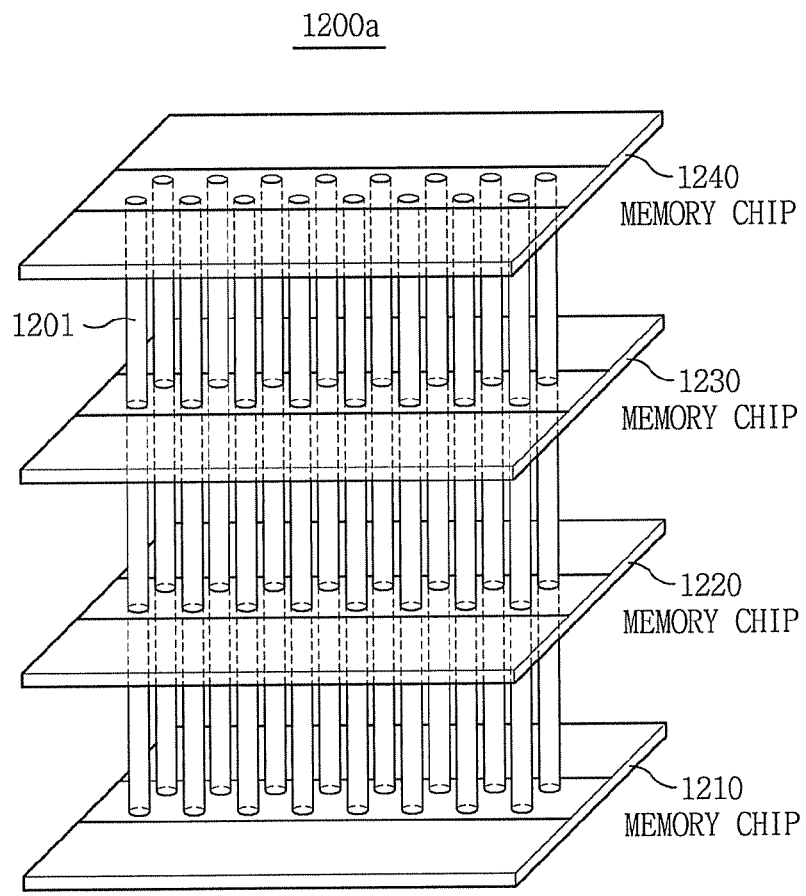
FIG. 2 is a schematic perspective view showing a three-dimensional structure of the stacked memory device in FIG. 1 in accordance with an example embodiment of inventive concepts.

FIG. 2 is a schematic perspective view showing a three-dimensional structure of the stacked memory device 1200 in FIG. 1 in accordance with an example embodiment of inventive concepts.

Referring to FIG. 2, the stacked memory device 1200a may include memory chips 1210, 1220, 1230 and 1240 connected by TSVs 1201. In FIG. 2, TSVs 1201 arranged in two rows are shown, but the stacked memory device 1200a may have an arbitrary number of TSVs.

Figure 3:
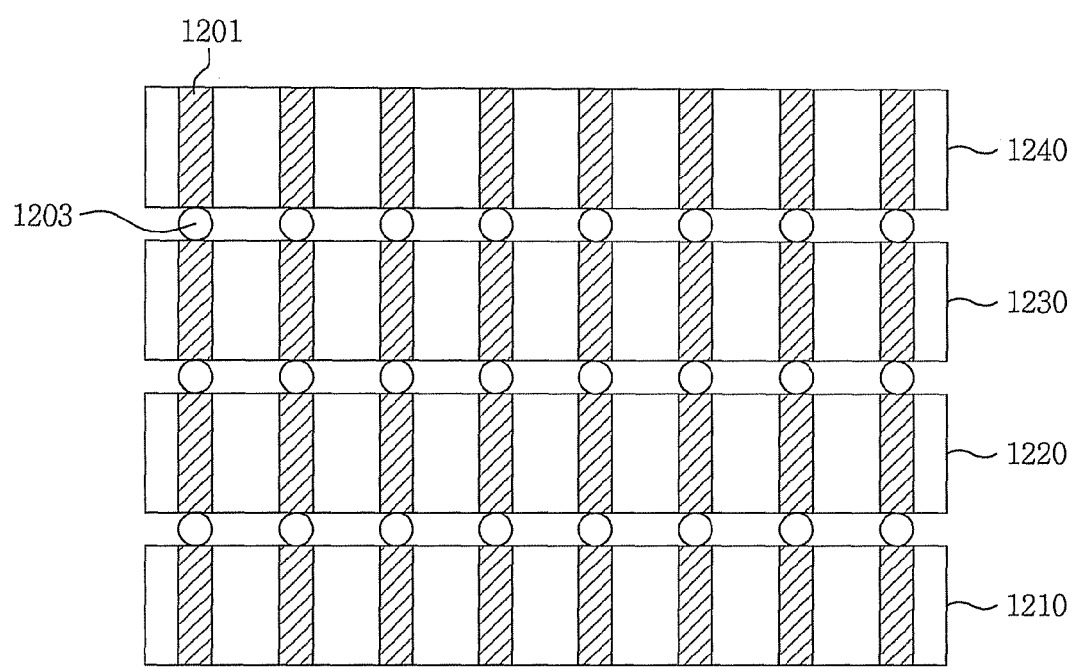
FIG. 3 is a cross-sectional view showing a vertical structure of the stacked memory device in FIG. 1 in accordance with an example embodiment of inventive concepts.

FIG. 3 is a cross-sectional view showing a vertical structure of the stacked memory device 1200 in FIG. 1 in accordance with an example embodiment of inventive concepts.

Referring to FIG. 3, the memory chips 1210, 1220, 1230 and 1240 may include TSVs 1201. Internal connecting terminals 1203 may be included between two of the memory chips 1210, 1220, 1230 and 1240 for electrically connecting each other. The internal connecting terminals 1203 may be aligned with the TSVs, and may include conductive bumps, solder balls or conductive spacers.

Further, the lowest lower surface of a memory chip among the memory chips 1210, 1220, 1230 and 1240 may be electrically connected to a memory controller or a processor chip through external connecting terminals.

Figure 4:
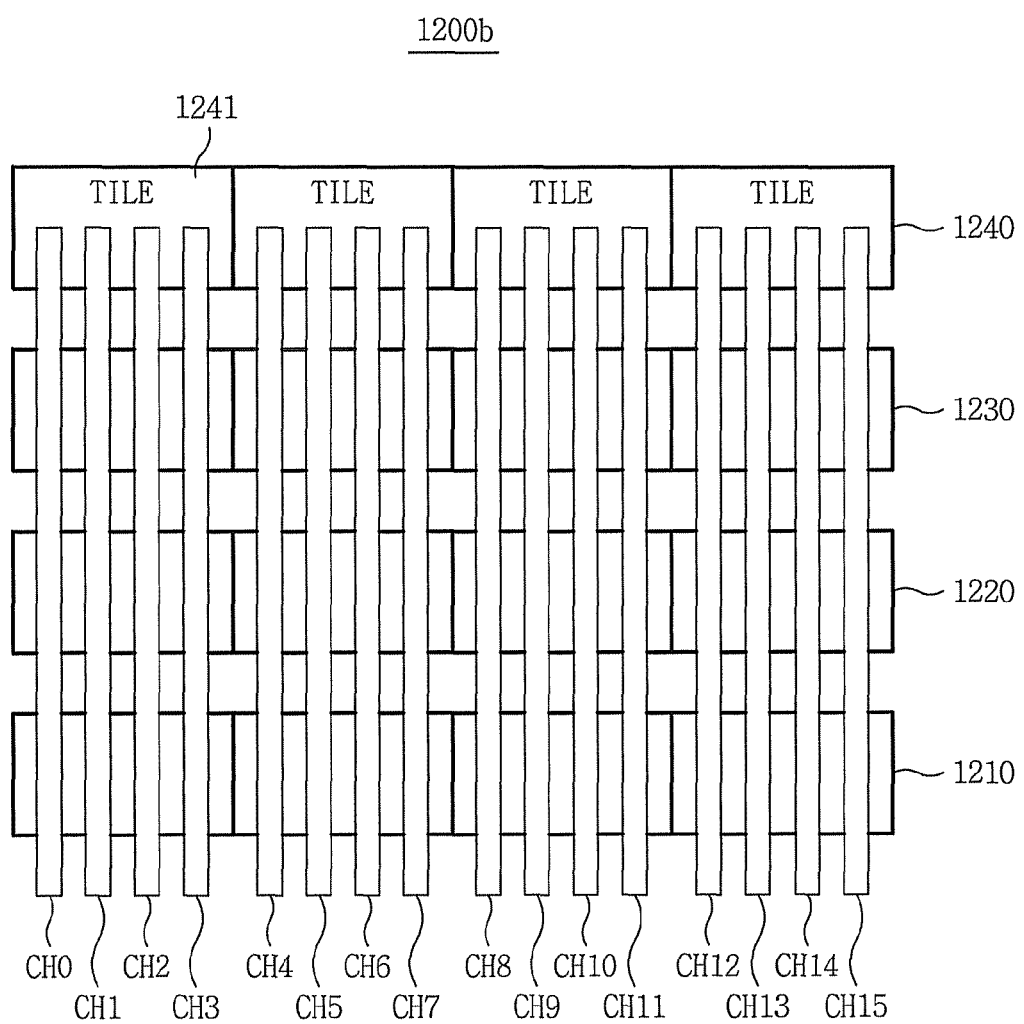
FIG. 4 is a cross-sectional view showing micro channels connected to memory chips included in the stacked memory device in FIG. 1 in accordance with an example embodiment of inventive concepts.

FIG. 4 is a cross-sectional view showing micro channels connected to memory chips included in the stacked memory device 1200 in FIG. 1 in accordance with an example embodiment of inventive concepts.

Referring to FIG. 4, the stacked memory device 1200 may include the memory chips 1210, 1220, 1230 and 1240, and micro channels CH0 to CH15 passing through the memory chips 1210, 1220, 1230 and 1240. Each of the micro channels CH0 to CH15 may include a plurality of through-silicon-vias (TSVs), and transmit and receive addresses, commands and data between the memory chips 1210, 1220, 1230 and 1240 and the outside.

In the example of FIG. 4, each of the memory chips 1210, 1220, 1230 and 1240 is comprised of four tiles 1241, and four channels are arranged in each tile.

Figure 5:
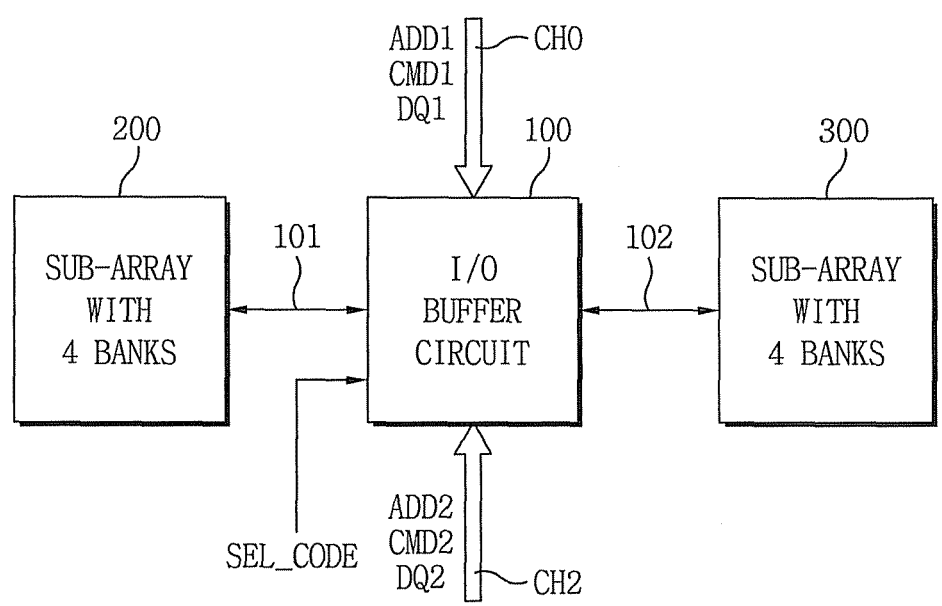
FIG. 5 is a block diagram showing a structure of a tile comprising each of memory chips included in the stacked memory device in FIG. 1 in accordance with an example embodiment of inventive concepts.

FIG. 5 is a block diagram showing a structure of a tile 1241 in each of memory chips included in the stacked memory device 1200 in FIG. 1 in accordance with an example embodiment of inventive concepts. In FIG. 5, a tile 1241 comprised of two sub memory arrays, each having four banks, and two micro channels CH0 and CH2 is shown as an example.

Referring to FIG. 5, the tile 1241 may include an input/output buffer circuit 100, a first sub memory array 200, and a second sub memory array 300.

The input/output buffer circuit 100 selects a micro channel or micro channels through which the tile 1241 is accessed in response to a selecting code SEL_CODE, and receives input data DQ1, DQ2 through the selected micro channel or selected micro channels to input to the first sub memory array 200 and/or the second sub memory array 300. The input/output buffer circuit 100 may output data from the first sub memory array 200 and/or the second sub memory array 300 through the selected micro channel or selected micro channels. The input/output buffer circuit 100 may transmit/receive data to/from the first sub memory array 200 through a first transmission line 101, and transmit/receive data to/from the second sub memory array 300 through a second transmission line 102.

Figure 6:
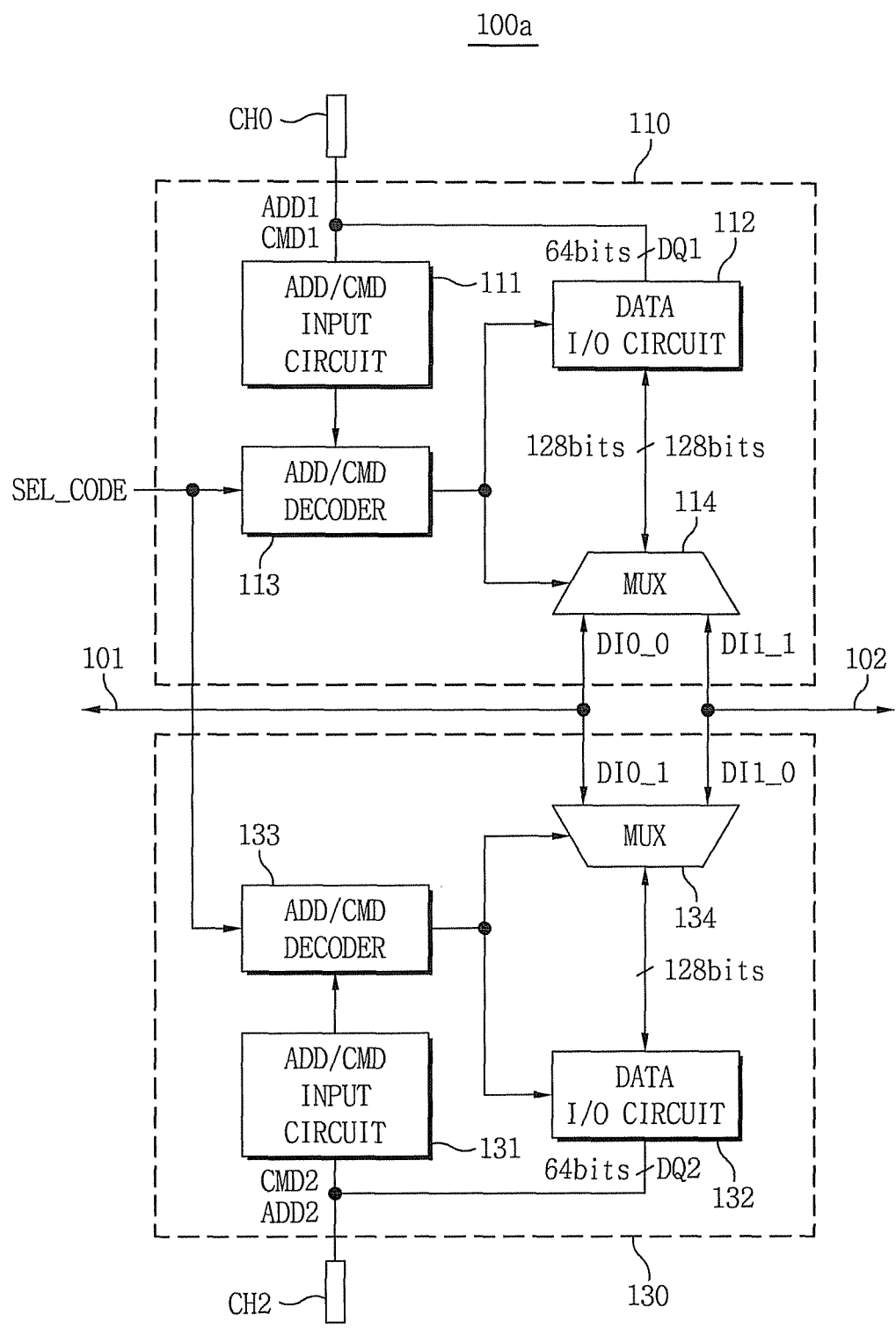
FIG. 6 is a circuit diagram showing an input/output buffer circuit included in the tile of FIG. 5 in accordance with an example embodiment of inventive concepts.

FIG. 6 is a circuit diagram showing an input/output buffer circuit 100 included in the tile 1241 of FIG. 5 in accordance with an example embodiment of inventive concepts.

Referring to FIG. 6, the input/output buffer circuit 100a may include a first buffer circuit 110 and a second buffer circuit 130.

The first buffer circuit 110 receives an address ADD1, a command CMD1 and input data DQ1 through a micro channel CH0 in response 1 to a selecting code SEL_CODE, and inputs input data DI0_0 and DI1_1 to the first sub memory array 200 in FIG. 5 and/or the second sub memory array 300 in FIG. 5 based on the address ADD1 and the command CMD1, or outputs data from the first sub memory array 200 and/or the second sub memory array 300 through the micro channel CH0. The second buffer circuit 130 receives an address ADD2, a command CMD2 and input data DQ2 through a micro channel CH2 in response to the selecting code SEL_CODE, and inputs input data DI1_0 and DI0_1 to the first sub memory array 200 and/or the second sub memory array 300 based on the address ADD and the command CMD, or outputs data from the first sub memory array 200 and/or the second sub memory array 300 through the micro channel CH2.

The command and the data received through the micro channel CH0 may be different from the command and the data received through the micro channel CH2. Further, the data input to the sub memory arrays 200 and 300 may be different from the data output from the sub memory arrays 200 and 300. Further, in the example of FIG. 6, when data input/output circuits 112 and 132 have a data width of 64 bits and a 2-bit pre-fetch structure, data input to or output from the sub memory arrays 200 and 300 may have 128 bits.

The first buffer circuit 110 may include a first address/command input circuit 111, a first address/command decoder 113, a first data input/output circuit 112, and a first multiplexer 114.

The first address/command input circuit 111 receives the first address ADD1, the first command CMD1 and the first input data DQ1 through the micro channel CH0. The first address/command decoder 113 decodes the first address ADD1 and the first command CMD1 in response to the selecting code SEL_CODE. The first data input/output circuit 112 receives the first input data DQ1, or outputs the first output data in response to the decoded first address and the decoded first command. The first multiplexer 114 inputs the first input data DQ1 to the first sub memory array 200 and/or the second sub memory array 300 in response to the decoded first address and the decoded first command, or receives the first output data from the first sub memory array 200 and/or the second sub memory array 300 to provide to the first data input/output circuit 112. It should be understood that DI0_0 and DI1_1 represent the first input data DQ1 output to the sub memory arrays 200 and 300 and the data output from the sub memory arrays 200, 300 to the first buffer circuit 110.

The second buffer circuit 130 may include a second address/command input circuit 131, a second address/command decoder 133, a second data input/output circuit 132, and a second multiplexer 134.

The second address/command input circuit 131 receives the second address ADD2, the second command CMD2 and the second input data DQ2 through the micro channel CH2. The second address/command decoder 133 decodes the second address ADD2 and the second command CMD2 in response to the selecting code SEL_CODE. The second data input/output circuit 132 receives the second input data DQ2, or outputs the second output data in response to the decoded second address and the decoded second command. The second multiplexer 134 inputs the second input data DQ2 to the first sub memory array 200 and/or the second sub memory array 300 in response to the decoded second address and the decoded second command, or receives the second output data from the first sub memory array 200 and/or the second sub memory array 300 to provide to the second data input/output circuit 132. DI0_1 and DI1_0 represent the second input data DQ2 output to the sub memory arrays 200 and 300 and the data output from the sub memory arrays 200, 300 to the second buffer circuit.

Hereinafter, operation of the stacked memory device including the input/output buffer circuit 100a of FIG. 6 will be described with reference to FIGS. 5 and 6.

For example, when the selecting code SEL_CODE is "11", both the first address/command decoder 113 and the second address/command decoder 133 are enabled, and both the first buffer circuit 110 and the second buffer circuit 130 are activated, therefore the addresses ADD1, ADD2, the commands CMD1, CMD2 and the data DQ1, DQ2 may be transmitted through both the micro channel CH0 and the micro channel CH2. When the selecting code SEL_CODE is "01", the first address/command decoder 113 is enabled and the second address/command decoder 133 is disabled, and the first buffer circuit 110 is activated and the second buffer circuit 130 is inactivated. Therefore, the address ADD1, the command CMD1 and the data DQ1 may be transmitted through only the micro channel CH0. When the selecting code SEL_CODE is "10", the first address/command decoder 113 is disabled and the second address/command decoder 133 is enabled, and the first buffer circuit 110 is inactivated and the second buffer circuit 130 is activated. Therefore, the address ADD2, the command CMD2 and the data DQ2 may be transmitted through only the micro channel CH2. When the selecting code SEL_CODE is "00", both the first address/command decoder 113 and the second address/command decoder 133 are disabled, and both the first buffer circuit 110 and the second buffer circuit 130 are inactivated, therefore the addresses ADD1, ADD2, the commands CMD1, CMD2 and the data DQ1, DQ2 may not be transmitted through both the micro channel CH0 and the micro channel CH2.

Therefore, in the stacked memory device having a tile structure of FIG. 6, the number of micro channels for accessing a memory array included in each of the memory chips may vary. In the stacked memory device having a tile structure of FIG. 6, memory capacity accessed by each of the micro channels may vary. Further, in the stacked memory device having a tile structure of FIG. 6, the number of memory banks accessed by each of the micro channels may vary.

Figure 7:
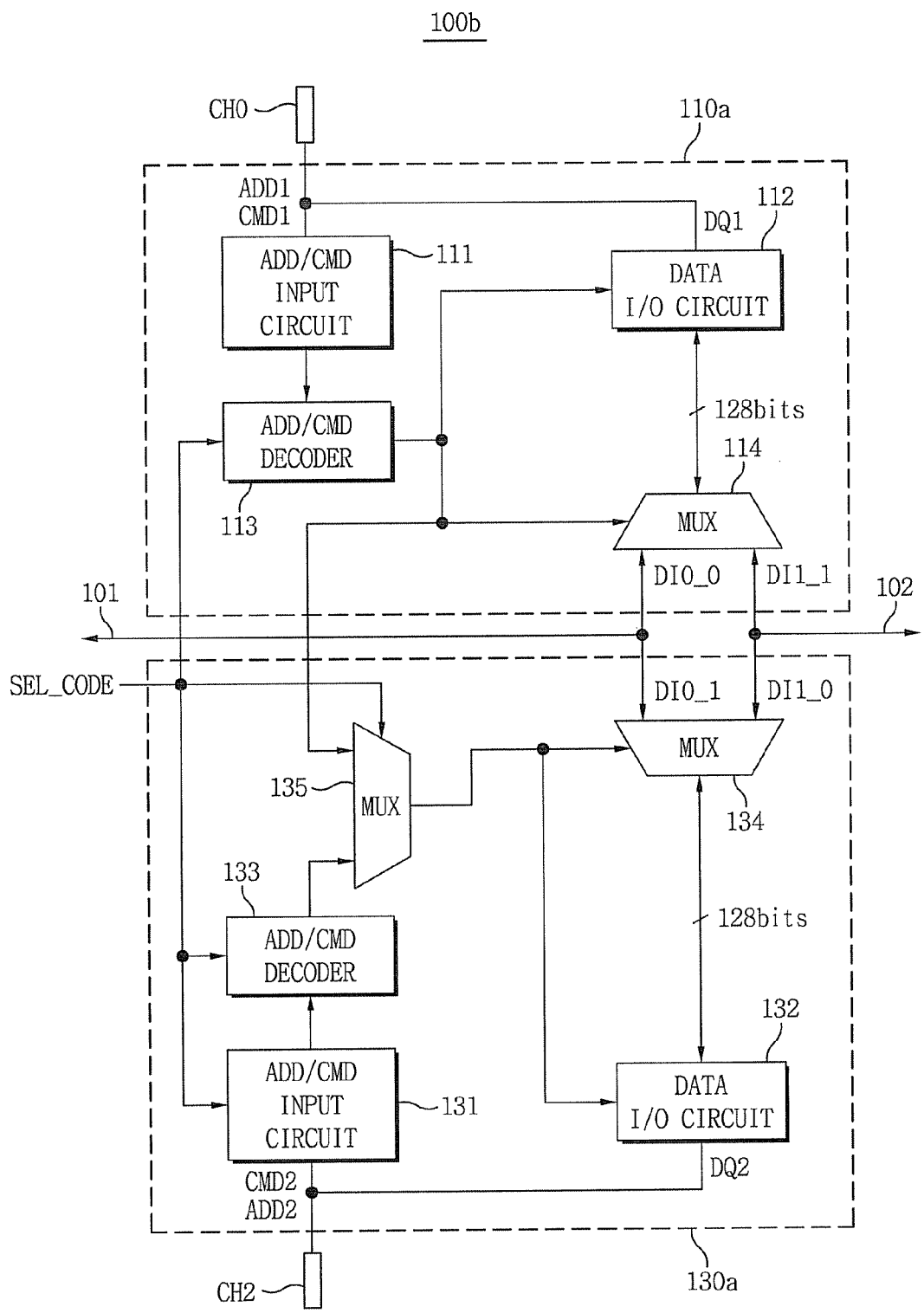
FIG. 7 is a circuit diagram showing an input/output buffer circuit included in the tile of FIG. 5 in accordance with another example embodiment of inventive concepts.

FIG. 7 is a circuit diagram showing an input/output buffer circuit 100 included in the tile 1241 of FIG. 5 in accordance with another example embodiment of inventive concepts.

Referring to FIG. 7, the input/output buffer circuit 100b may include a first buffer circuit 110a and a second buffer circuit 130a.

The first buffer circuit 110a may include a first address/command input circuit 111, a first address/command decoder 113, a first data input/output circuit 112, and a first multiplexer 114.

The first address/command input circuit 111 receives the first address ADD1, the first command CMD1 and the first input data DQ1 through the micro channel CH0. The first address/command decoder 113 decodes the first address ADD1 and the first command CMD1 in response to the selecting code SEL_CODE. The first data input/output circuit 112 receives the first input data DQ1, or outputs the first output data in response to the decoded first address and the decoded first command. The first multiplexer 114 inputs the first input data DQ1 to the first sub memory array 200 and/or the second sub memory array 300 in response to the decoded first address and the decoded first command, or receives the first output data from the first sub memory array 200 and/or the second sub memory array 300 to provide to the first data input/output circuit 112.

The second buffer circuit 130a may include a second address/command input circuit 131', a second address/command decoder 133, a second multiplexer 134, a second data input/output circuit 132, and a third multiplexer 135.

The second address/command input circuit 131' receives the second address ADD2, the second command CMD2 and the second input data DQ2 through the micro channel CH2. The second address/command decoder 133 decodes the second address and the second command in response to the selecting code SEL_CODE. The third multiplexer 135 selects one of an output signal of the first address/command decoder 113 and an output signal of the second address/command decoder 133 in response to the selecting code SEL_CODE. The second data input/output circuit 132 operates in response to the selecting code SEL_CODE, and receives the second input data DQ2, or outputs the second output data in response to an output signal of the third multiplexer 135. The second multiplexer 134 inputs the second input data DQ2 to the first sub memory array 200 and/or the second sub memory array 300 in response to the output signal of the third multiplexer 135, or receives the second output data from the first sub memory array 200 and/or the second sub memory array 300 to provide to the second data input/output circuit 132.

Hereinafter, operation of the stacked memory device including the input/output buffer circuit 100b of FIG. 7 will be described with reference to FIGS. 5 and 7.

For example, when the selecting code SEL_CODE is "11", the first address/command decoder 113, the second address/command decoder 133 and the second address/command input circuit 131' are enabled, and both the first buffer circuit 110a and the second buffer circuit 130a are activated, therefore the addresses ADD1, ADD2, the commands CMD1, CMD2 and the data DQ1, DQ2 may be transmitted through both the micro channel CH0 and the micro channel CH2. When the selecting code SEL_CODE is "11", the third multiplexer 135 selects and outputs an output signal of the second address/command decoder 133 among an output signal of the first address/command decoder 113 and the output signal of the second address/command decoder 133.

When the selecting code SEL_CODE is "01", the first address/command decoder 113 is enabled and the second address/command decoder 133 and the second address/command input circuit 131' are disabled, and the first buffer circuit 110 is activated, and the data is input to the first sub memory array 200 and/or the second sub memory array 300, or output from the first sub memory array 200 and/or the second sub memory array 300 through the micro channel CH0. Further, when the selecting code SEL_CODE is "01", the third multiplexer 135 selects and outputs an output signal of the first address/command decoder 113 among the output signal of the first address/command decoder 113 and the output signal of the second address/command decoder 133. Then, the data DQ2 transmitted through the micro channel CH2 is received through the micro channel CH0 to input or output in response to the address and the command decoded by the first address/command decoder 113.

When the selecting code SEL_CODE is "10", the first address/command decoder 113 is disabled and the second address/command decoder 133 and the second address/command input circuit 131' are enabled, and the second buffer circuit 130 is activated and the first buffer circuit 110 is inactivated. Therefore, the address ADD2, the command CMD2 and the data DQ2 may be transmitted through only the micro channel CH2. When the selecting code SEL_CODE is "00", both the first address/command decoder 113, the second address/command decoder 133 and the second address/command input circuit 131 are disabled, and both the first buffer circuit 110 and the second buffer circuit 130 are inactivated, therefore the addresses ADD1, ADD2, the commands CMD1, CMD2 and the data DQ1, DQ2 may not be transmitted through both the micro channel CH0 and the micro channel CH2.

Therefore, in the stacked memory device having a tile structure of FIG. 7, the number of micro channels for accessing a memory array included in each of the memory chips may vary. In the stacked memory device having a tile structure of FIG. 7, memory capacity accessed by each of the micro channels may vary. Further, in the stacked memory device having a tile structure of FIG. 7, the number of memory banks accessed by each of the micro channels may vary.

In addition, in the stacked memory device having a tile structure of FIG. 7, data having 128 bits is transmitted through the micro channel CH0, and data having 128 bits is transmitted through the micro channel CH2 even when the second address/command decoder 133 and the second address/command input circuit 131' are disabled. Therefore, when data input/output circuits 112 and 132 included in the stacked memory device have a 2-bit pre-fetch structure, the stacked memory device may have an internal data bus width of 256 bits and an input/output data structure of X128.

Figure 8:
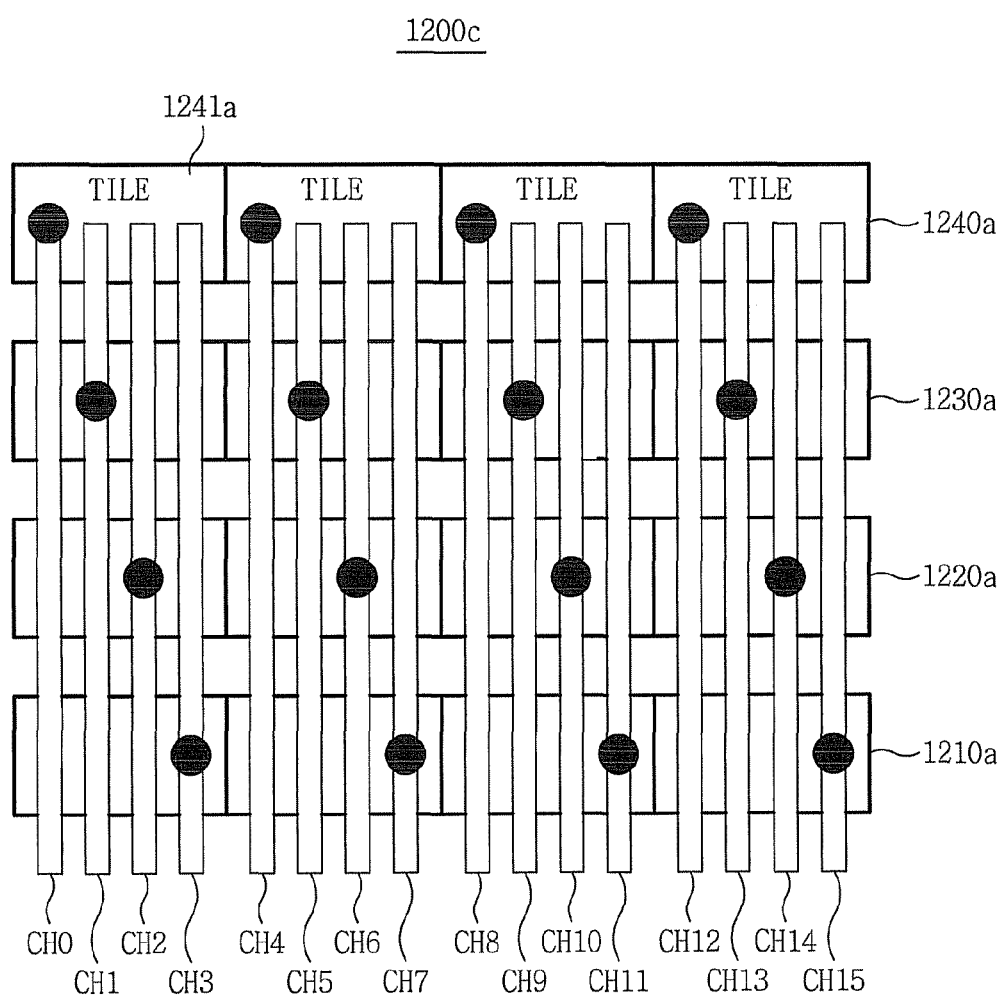
FIG. 8 is a cross-sectional view showing micro channels for accessing memory chips included in the stacked memory device when four memory chips are included in the stacked memory device in FIG. 1 according to an example embodiment.

FIG. 8 is a cross-sectional view showing micro channels for accessing memory chips included in the stacked memory device when four memory chips are included in the stacked memory device in FIG. 1.

Referring to FIG. 8, the stacked memory device 1200c may include the memory chips 1210a, 1220a, 1230a and 1240a, and micro channels CH0 to CH15 passing through the memory chips 1210a, 1220a, 1230a and 1240a. Each of the micro channels CH0 to CH15 may include a plurality of through-silicon-vias (TSVs), and transmit and receive addresses, commands and data between the memory chips 1210a, 1220a, 1230a and 1240a and the outside.

In the example of FIG. 8, each of the memory chips 1210a, 1220a, 1230a and 1240a is comprised of four tiles 1241a, and four channels are arranged in each tile.

The stacked memory device 1200c may include a $1^{st}$ memory chip 1210a, a $2^{nd}$ memory chip 1220a stacked above the $1^{st}$ memory chip 1210a, a $3^{rd}$ memory chip 1230a stacked above the $2^{nd}$ memory chip 1220a, and a $4^{th}$ memory chip 1240a stacked above the $3^{rd}$ memory chip 1230a.

The $4^{th}$ memory chip 1240a is accessed by a $1^{st}$ micro channel CH0, a $5^{th}$ micro channel CH4, a $9^{th}$ micro channel CH8, and a $13^{th}$ micro channel CH12. The $3^{rd}$ memory chip 1230a is accessed by a $2^{nd}$ micro channel CH1, a $6^{th}$ micro channel CH5, a $10^{th}$ micro channel CH9, and a $14^{th}$ micro channel CH13. The $2^{nd}$ memory chip 1220a is accessed by a $3^{rd}$ micro channel CH2, a $7^{th}$ micro channel CH6, an $11^{th}$ micro channel CH10, and a $15^{th}$ micro channel CH14. The $1^{st}$ memory chip 1210a is accessed by a $4^{th}$ micro channel CH3, an $8^{th}$ micro channel CH7, a $12^{th}$ micro channel CH11, and a $16^{th}$ micro channel CH15.

Figure 9:
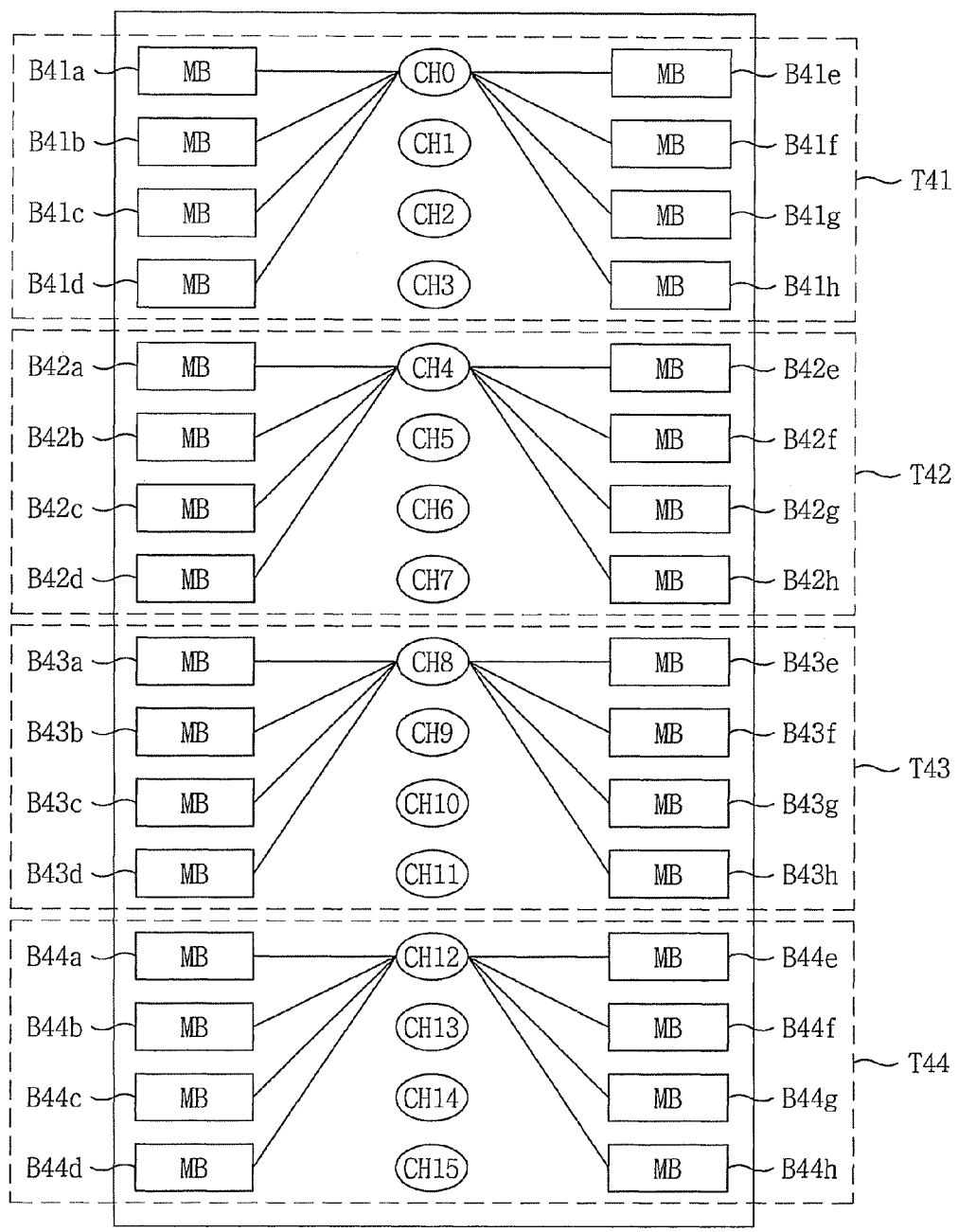
FIG. 9 is a diagram showing micro channels for accessing memory banks of a memory chip disposed in the fourth layer of the stacked memory device of FIG. 8 according to example embodiment.

FIG. 9 is a diagram showing micro channels for accessing memory banks of a memory chip disposed in the $4^{th}$ layer of the stacked memory device of FIG. 8.

Referring to FIG. 9, the $4^{th}$ memory chip 1240a may include a $1^{st}$ tile T41, a $2^{nd}$ tile T42, a $3^{rd}$ tile T43, and a $4^{th}$ tile T44. The $1^{st}$ tile T41 may include $1^{st}$ memory banks B41a to B41h accessed by the $1^{st}$ micro channel CH0. The $2^{nd}$ tile T42 may include $2^{nd}$ memory banks B42a to B42h accessed by the $5^{th}$ micro channel CH4. The $3^{rd}$ tile T43 may include $3^{rd}$ memory banks B43a to B43h accessed by the 9$^{th}$ micro channel CH8. The 4$^{th}$ tile T44 may include 4$^{th}$ memory banks B44a to B44h accessed by the 13$^{th}$ micro channel CH12.

Figure 10:
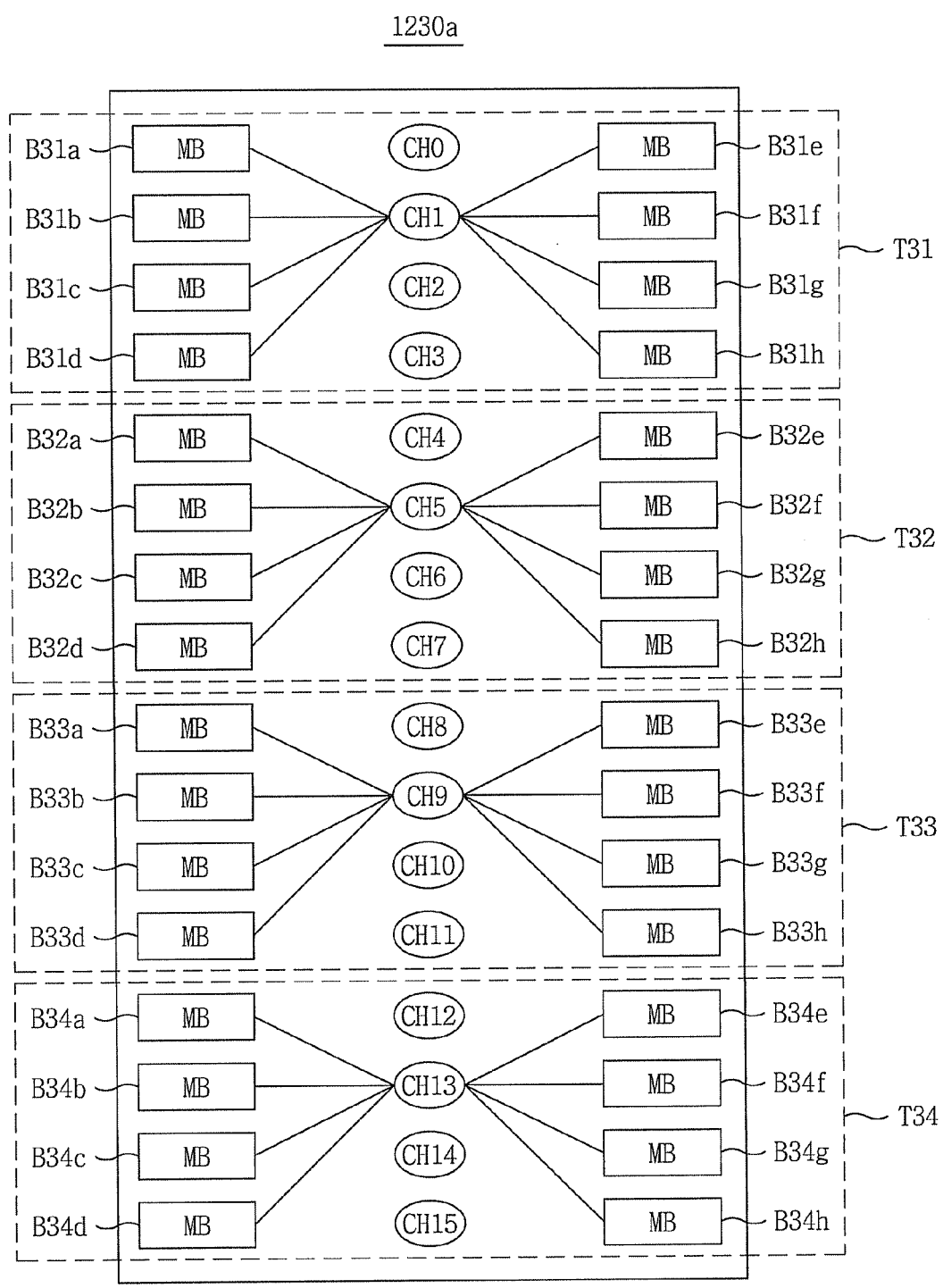
FIG. 10 is a diagram showing micro channels for accessing memory banks of a memory chip disposed in the third layer of the stacked memory device of FIG. 8 according to an example embodiment.

FIG. 10 is a diagram showing micro channels for accessing memory banks of a memory chip disposed in the 3$^{rd}$ layer of the stacked memory device of FIG. 8.

Referring to FIG. 10, the 3$^{rd}$ memory chip 1230a may include a 1$^{st}$ tile T31, a 2$^{nd}$ tile T32, a 3$^{rd}$ tile T33, and a 4$^{th}$ tile T34. The 1$^{st}$ tile T31 may include 1$^{st}$ memory banks B31a to B31h accessed by the 2$^{nd}$ micro channel CH1. The 2$^{nd}$ tile T32 may include 2$^{nd}$ memory banks B32a to B32h accessed by the 6$^{th}$ micro channel CH5. The 3$^{rd}$ tile T33 may include 3$^{rd}$ memory banks B33a to B33h accessed by the 10$^{th}$ micro channel CH9. The 4$^{th}$ tile T34 may include 4$^{th}$ memory banks B34a to B34h accessed by the 14$^{th}$ micro channel CH13.

Figure 11:
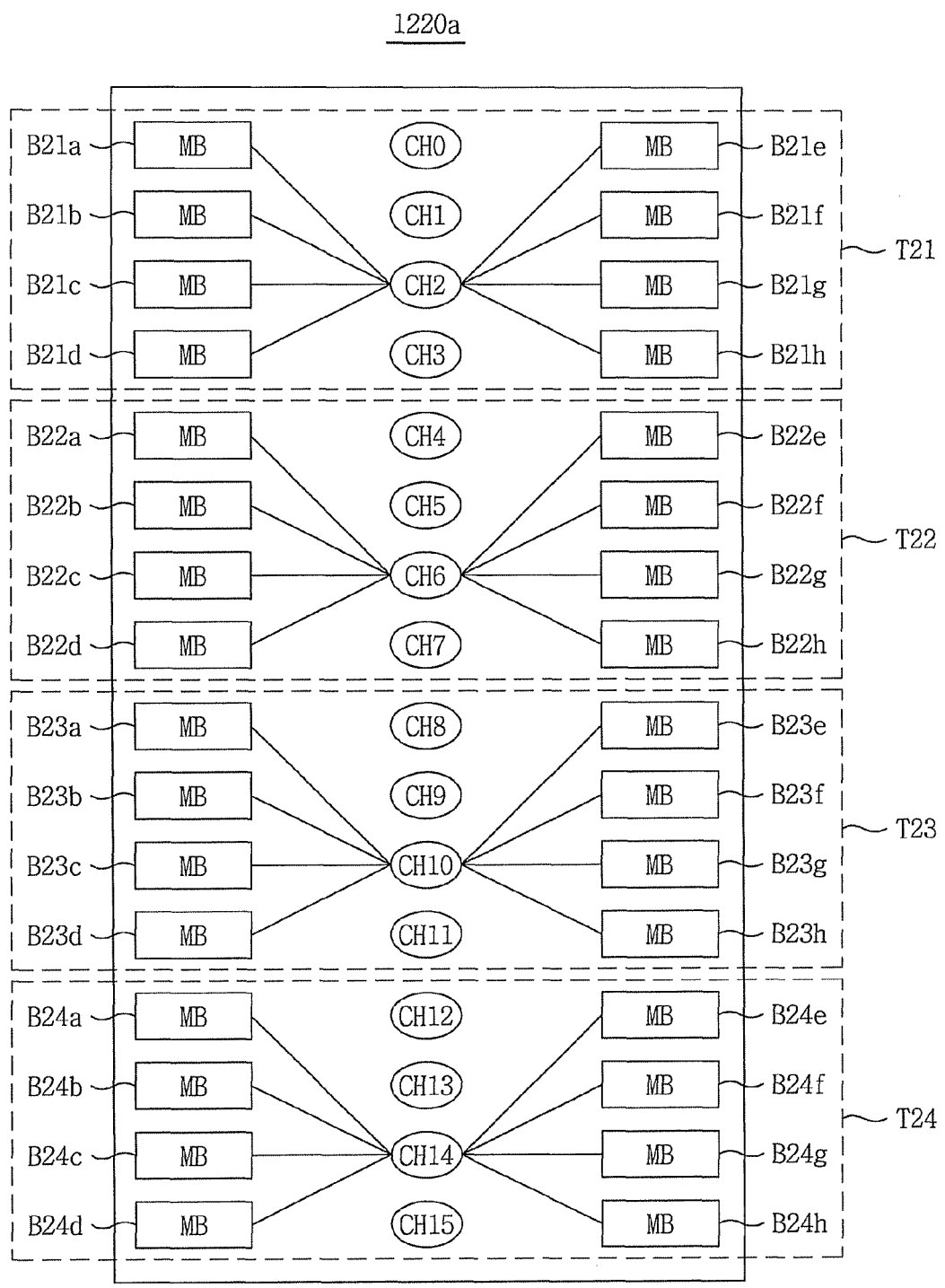
FIG. 11 is a diagram showing micro channels for accessing memory banks of a memory chip disposed in the second layer of the stacked memory device of FIG. 8 according to an example embodiment.

FIG. 11 is a diagram showing micro channels for accessing memory banks of a memory chip disposed in the 2$^{nd}$ layer of the stacked memory device of FIG. 8.

Referring to FIG. 11, the 2$^{nd}$ memory chip 1220a may include a 1$^{st}$ tile T21, a 2$^{nd}$ tile T22, a 3$^{rd}$ tile T23, and a 4$^{th}$ tile T24. The 1$^{st}$ tile T21 may include 1$^{st}$ memory banks B21a to B21h accessed by the 3$^{rd}$ micro channel CH2. The 2$^{nd}$ tile T22 may include memory banks B22a to B22h accessed by the 7$^{th}$ micro channel CH6. The 3$^{rd}$ tile T23 may include 3$^{rd}$ memory banks B23a to B23h accessed by the 11$^{th}$ micro channel CH10. The 4$^{th}$ tile T24 may include 4$^{th}$ memory banks B24a to B24h accessed by the 15$^{th}$ micro channel CH14.

Figure 12:
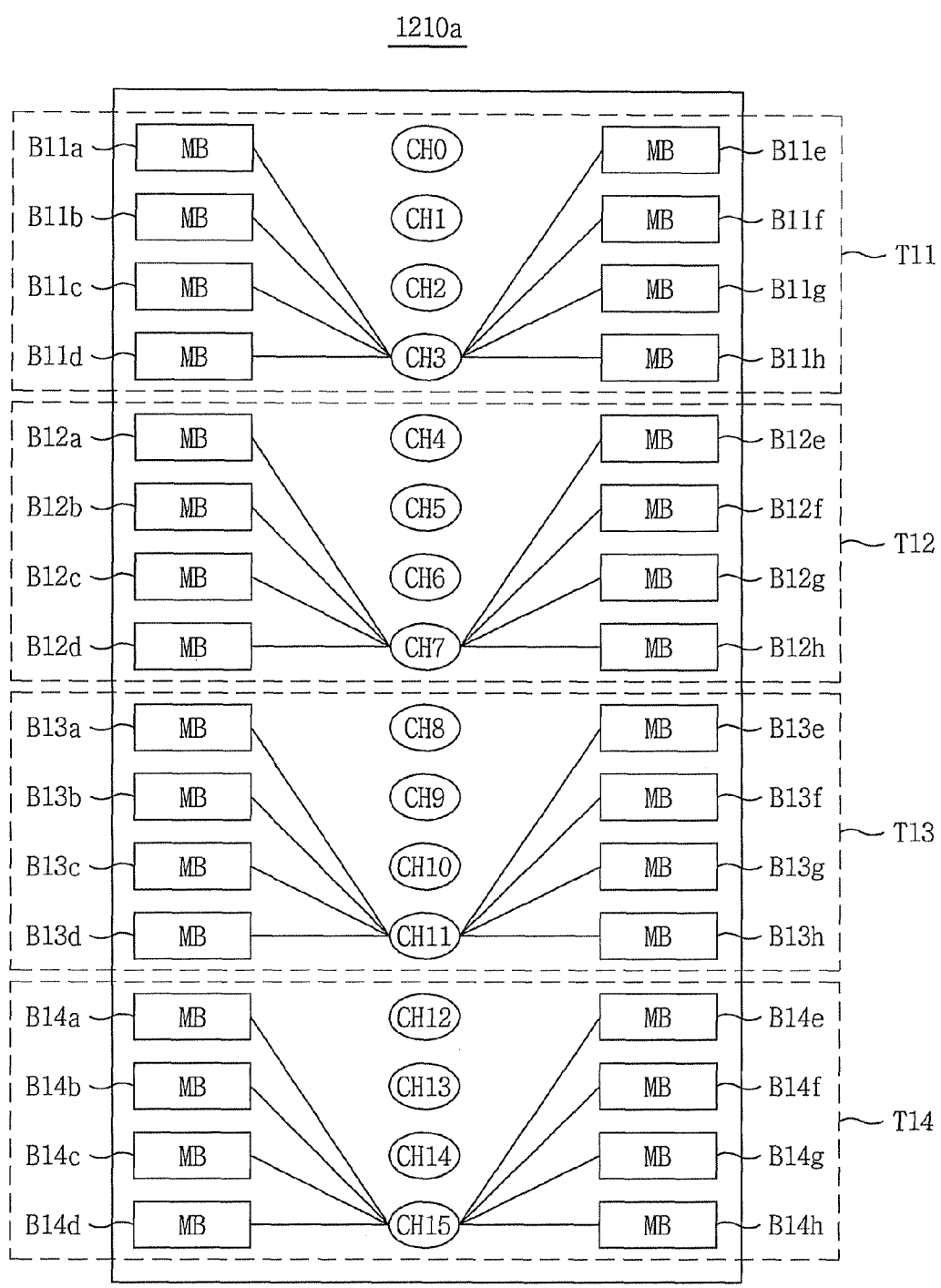
FIG. 12 is a diagram showing micro channels for accessing memory banks of a memory chip disposed in the first layer of the stacked memory device of FIG. 8 according to example embodiments.

FIG. 12 is a diagram showing micro channels for accessing memory banks of a memory chip disposed in the 1$^{st}$ layer of the stacked memory device of FIG. 8.

Referring to FIG. 12, the 2$^{nd}$ memory chip 1210a may include a 1$^{st}$ tile T11, a 2$^{nd}$ tile T12, a 3$^{rd}$ tile T13, and a 4$^{th}$ tile T14. The 1$^{st}$ tile T11 may include 1$^{st}$ memory banks B11a to B11h accessed by the 4$^{th}$ micro channel CH3. The 2$^{nd}$ tile T12 may include 2$^{nd}$ memory banks B12a to B12h accessed by the 8$^{th}$ micro channel CH7. The 3$^{rd}$ tile T13 may include 3$^{rd}$ memory banks B13a to B13h accessed by the 12$^{th}$ micro channel CH11. The 4$^{th}$ tile T14 may include 4$^{th}$ memory banks B14a to B14h accessed by the 16$^{th}$ micro channel CH15.

Figure 13:
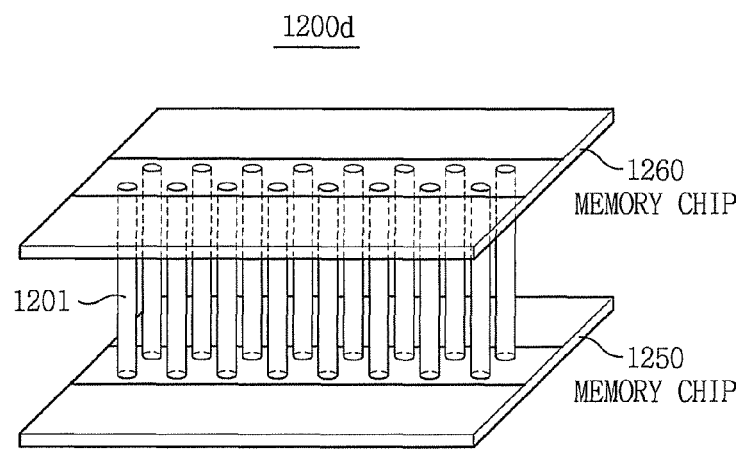
FIG. 13 is a schematic perspective view showing a three-dimensional structure of the stacked memory device in FIG. 1 in accordance with another example embodiment of inventive concepts.

FIG. 13 is a schematic perspective view showing a three-dimensional structure of the stacked memory device in FIG. 1 in accordance with another example embodiment of inventive concepts.

Referring to FIG. 13, the stacked memory device 1200d may include memory chips 1250 and 1260 connected by TSVs 1201. In FIG. 13, TSVs 1201 arranged in two rows are shown, but the stacked memory device 1200d may have an arbitrary number of TSVs.

Figure 14:
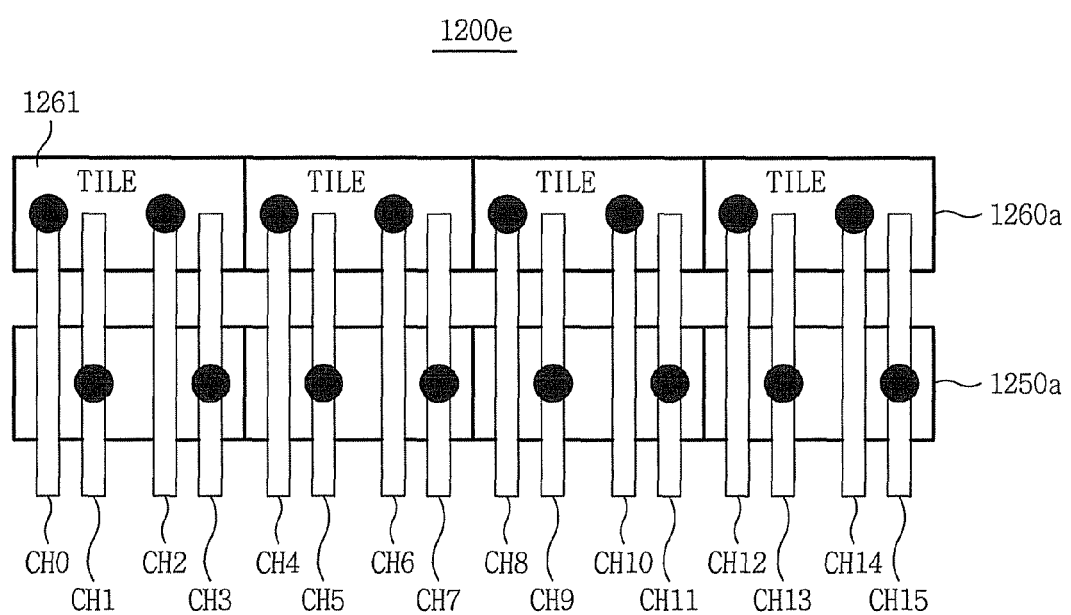
FIG. 14 is a cross-sectional view showing micro channels for accessing memory chips included in the stacked memory device when two memory chips are included in the stacked memory device in FIG. 13 according to an example embodiment.

FIG. 14 is a cross-sectional view showing micro channels for accessing memory chips included in the stacked memory device when two memory chips are included in the stacked memory device in FIG. 13.

Referring to FIG. 14, the stacked memory device 1200e may include stacked memory chips 1250a and 1260a, and micro channels CH0 to CH15 passing through the memory chips 1250a and 1260a. Each of the 1$^{st}$ to 16$^{th}$ micro channels CH0 to CH15 may have a plurality of TSVs, and through which data is transmitted/received between the memory chips 1250a and 1260a and the outside.

In the example of FIG. 14, each of the memory chips 1250a and 1260a is comprised of four tiles 1261, and four channels are arranged in each tile.

The stacked memory device may include a 1$^{st}$ memory chip 1250a, and a 2$^{nd}$ memory chip 1260a stacked above the 1$^{st}$ memory chip 1250a.

The 2$^{nd}$ memory chip 1260a is accessed by a 1$^{st}$ micro channel CH0, a 3$^{rd}$ micro channel CH2, a 5$^{th}$ micro channel CH4, 7$^{th}$ micro channel CH6, a 9$^{th}$ micro channel CH8, an 11$^{th}$ micro channel CH10, a 13$^{th}$ micro channel CH12, and a 15$^{th}$ micro channel CH14. The 1$^{st}$ memory chip 1250a is accessed by a 2$^{nd}$ micro channel CH1, a 4$^{th}$ micro channel CH3, a 6$^{th}$ micro channel CH5, an 8$^{th}$ micro channel CH7, a 10$^{th}$ micro channel CH9, a 12$^{th}$ micro channel CH11, a 14$^{th}$ micro channel CH13, and a 16$^{th}$ micro channel CH15.

Figure 15:
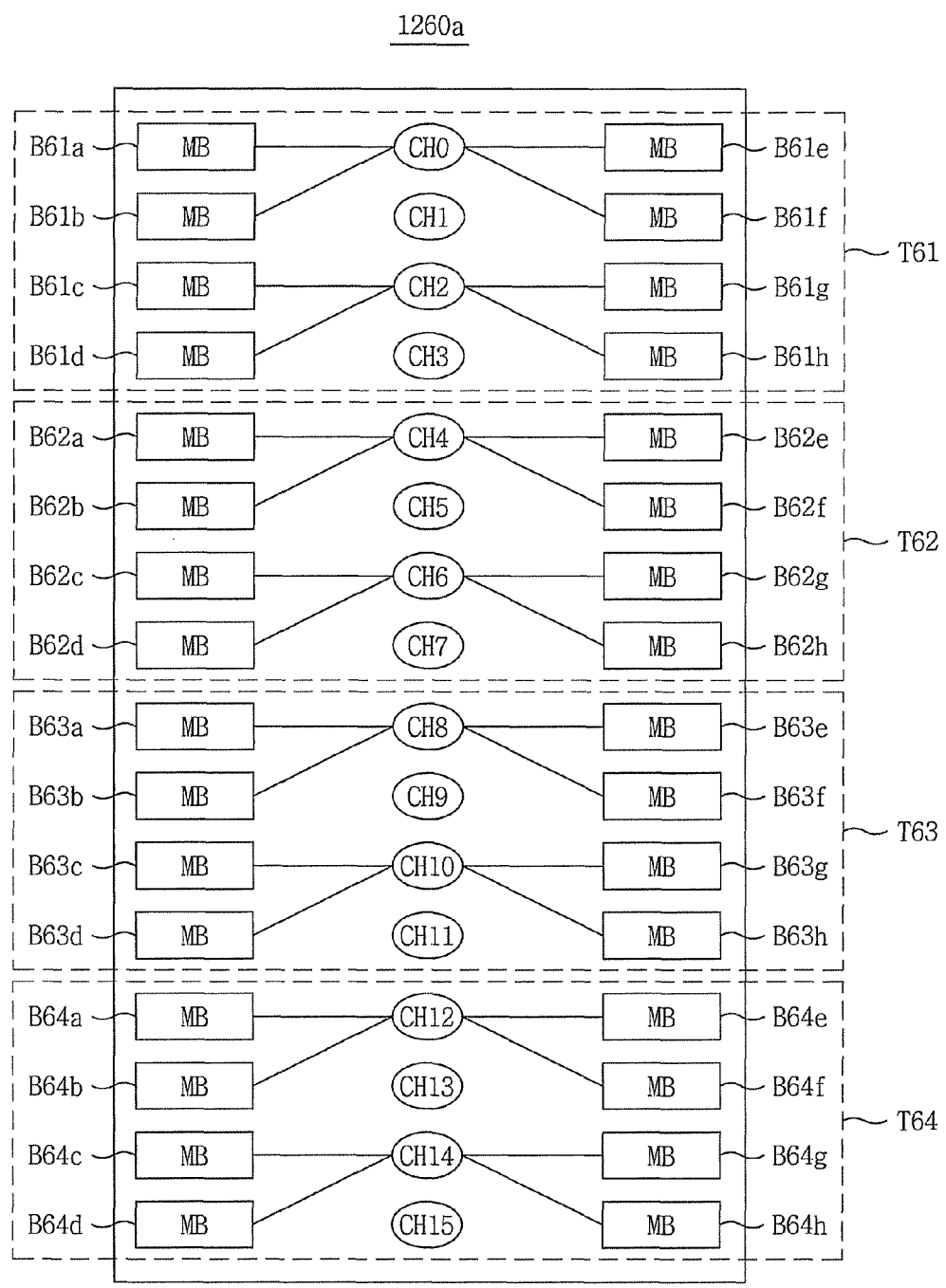
FIG. 15 is a diagram showing micro channels for accessing memory banks of a memory chip disposed in the second layer of the stacked memory device of FIG. 14 according to an example embodiment.

FIG. 15 is a diagram showing micro channels for accessing memory banks of a memory chip disposed in the 2$^{nd}$ layer of the stacked memory device of FIG. 14.

Referring to FIG. 15, the 2$^{nd}$ memory chip 1260a may include a first tile T61, a second tile T62, a third tile T63, and a 4$^{th}$ tile T64.

The 1$^{st}$ tile T61 may include 1$^{st}$ memory banks B61a to B61d accessed by the 1$^{st}$ micro channel CH0, and 2$^{nd}$ memory banks B61e to B61h accessed by the 3$^{rd}$ micro channel CH2. The 2$^{nd}$ tile T62 may include 3$^{rd}$ memory banks B62a to B62d accessed by the 5$^{th}$ micro channel Ch4, and 4$^{th}$ memory banks B62e to B62h accessed by the 7$^{th}$ micro channel CH6. The 3$^{rd}$ tile T63 may include 5$^{th}$ memory banks B63a to B63d accessed by the 9$^{th}$ micro channel CH8, and 6th memory banks B63e to B63h accessed by the 11$^{th}$ micro channel CH10. The 4$^{th}$ tile T64 may include 7$^{th}$ memory banks B64a to B64d accessed by the 13$^{th}$ micro channel B12, and 8$^{th}$ memory banks B64e to B64h accessed by the 15$^{th}$ micro channel CH14.

Figure 16:
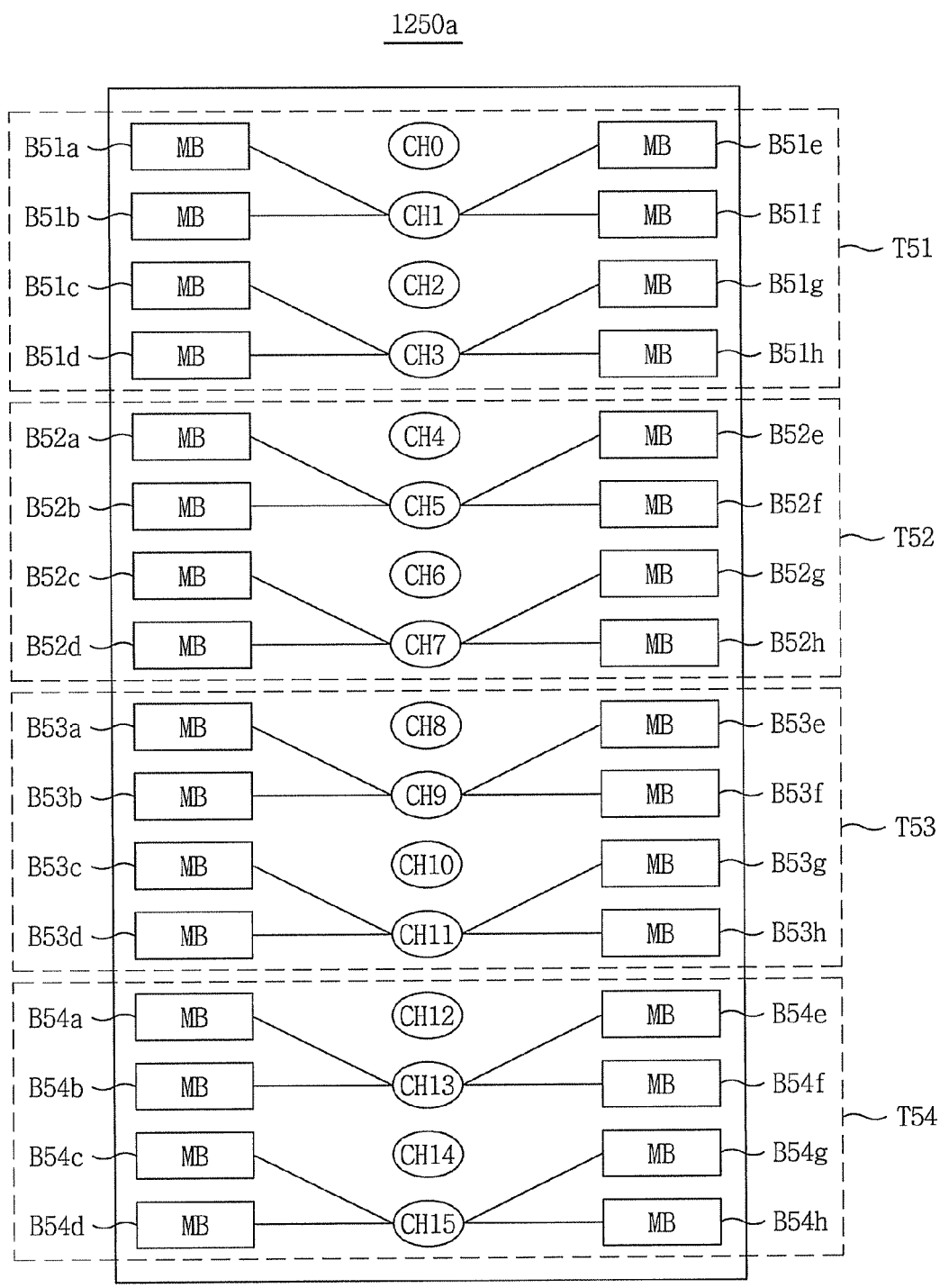
FIG. 16 is a diagram showing micro channels for accessing memory banks of a memory chip disposed in the first layer of the stacked memory device of FIG. 14 according to an example embodiment.

FIG. 16 is a diagram showing micro channels for accessing memory banks of a memory chip disposed in the 1$^{st}$ layer of the stacked memory device of FIG. 14.

Referring to FIG. 16, the 1$^{st}$ memory chip 1250a may include a first tile T51, a second tile T52, a third tile T53, and a 4$^{th}$ tile T54.

The 1$^{st}$ tile T51 may include 1$^{st}$ memory banks B51a to B51d accessed by the 2$^{nd}$ micro channel CH1, and 2$^{nd}$ memory banks B51e to B51h accessed by the 4$^{th}$ micro channel CH3. The 2$^{nd}$ tile T52 may include 3$^{rd}$ memory banks B52a to B52d accessed by the 6$^{th}$ micro channel Ch5, and 4$^{th}$ memory banks B52e to B52h accessed by the 8$^{th}$ micro channel CH7. The 3$^{rd}$ tile T53 may include 5$^{th}$ memory banks B53a to B53d accessed by the 10$^{th}$ micro channel CH9, and 6th memory banks B53e to B53h accessed by the 12$^{th}$ micro channel CH11. The 4$^{th}$ tile T54 may include 7$^{th}$ memory banks B54a to B54d accessed by the 14$^{th}$ micro channel B13, and 8$^{th}$ memory banks B54e to B54h accessed by the 16$^{th}$ micro channel CH15.

Figure 17:
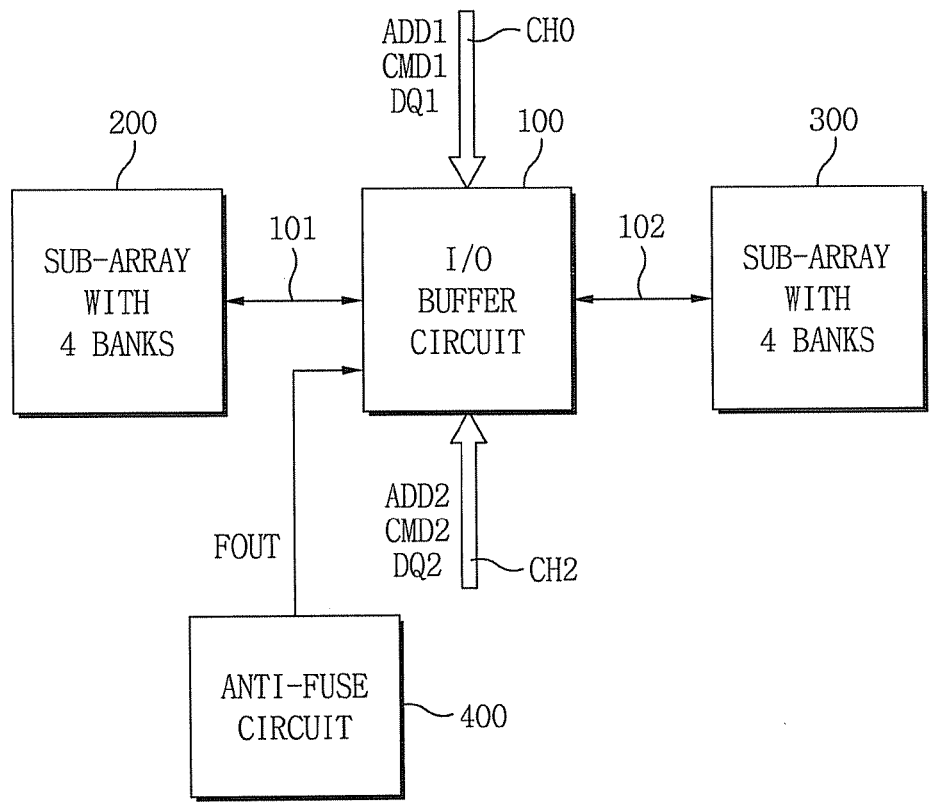
FIG. 17 is a block diagram showing a structure of a tile comprising each of memory chips included in the stacked memory device in FIG. 1 in accordance with another example embodiment of inventive concepts.

FIG. 17 is a block diagram showing a structure of a tile comprising each of memory chips included in the stacked memory device in FIG. 1 in accordance with another example embodiment of inventive concepts. In FIG. 17, a tile comprised of two sub memory arrays having four banks and two micro channels CH0 and CH2 is shown as an example.

Referring to FIG. 17, the tile 1241a may include an input/output buffer circuit 100, a first sub memory array 200 and a second sub memory array 300.

The input/output buffer circuit 100 selects a micro channel or micro channels through which the tile 1241 is accessed in response to an anti-fuse output signal FOUT, and receives input data DQ through the selected micro channel or the selected micro channels to input to the first sub memory array 200 and/or the second sub memory array 300. The input/output buffer circuit 100 may output data from the first sub memory array 200 and/or the second sub memory array 300 through the selected micro channel or the selected micro channels. The input/output buffer circuit 100 may transmit/receive data to/from the first sub memory array 200 through a first transmission line 101, and transmit/receive data to/from the second sub memory array 300 through a second transmission line 102. The anti-fuse output signal FOUT may be generated by the anti-fuse circuit 400.

Figure 18:
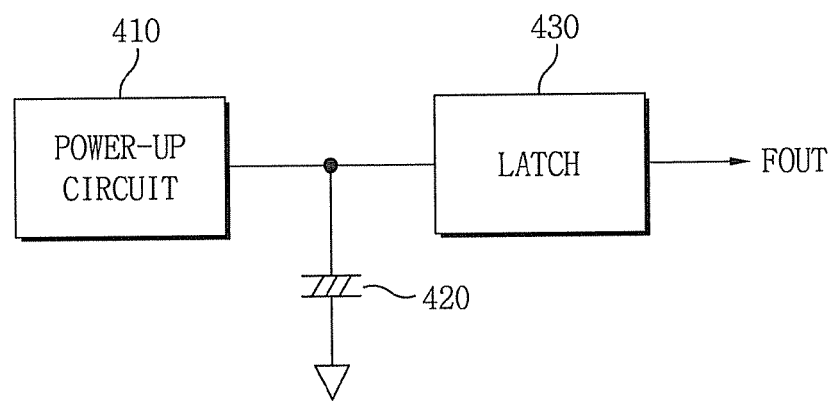
FIG. 18 is a circuit diagram showing an anti-fuse circuit in FIG. 17 in accordance with an example embodiment of inventive concepts.

FIG. 18 is a circuit diagram showing an anti-fuse circuit 400 in FIG. 17 in accordance with an example embodiment of inventive concepts.

Referring to FIG. 18, the anti-fuse circuit 400 may include a power-up circuit 410, an anti-fuse 420 and a latch circuit 430. The power-up circuit 410 may be used to read a state of the anti-fuse 420 when a memory device is initially turned on, while the latch circuit 430 may be used to latch the state of the anti-fuse 420 during a normal operation.

In the example of FIG. 17 and FIG. 18, the input/output buffer circuit 100 operates in response to the anti-fuse output signal FOUT, but the input/output buffer circuit 100 may operate in response to a laser fuse output signal or an input signal from outside of a memory chip in addition to the anti-fuse output signal FOUT.

Figure 19:
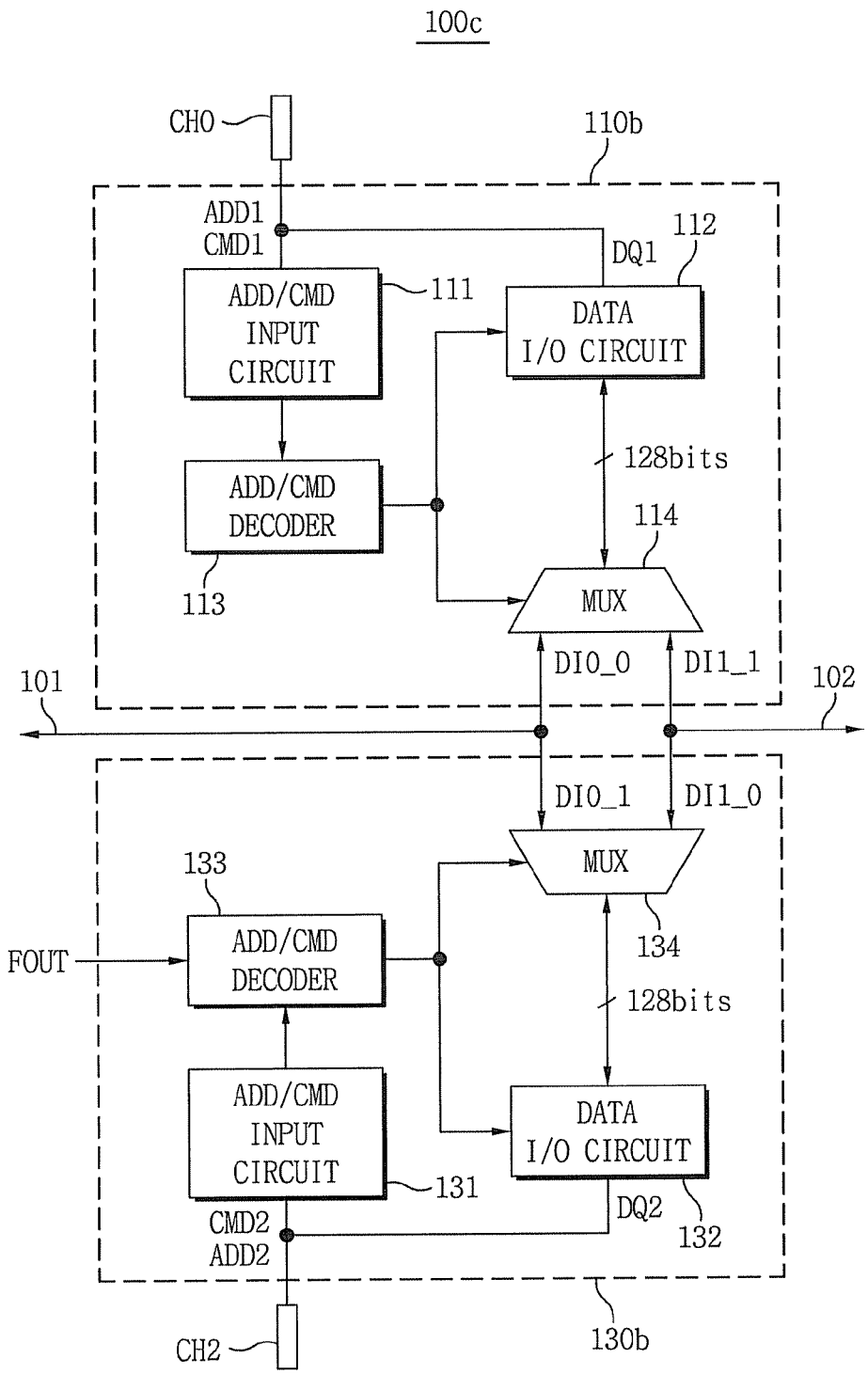
FIG. 19 is a circuit diagram showing an input/output buffer circuit included in the structure of the tile shown in FIG. 17 in accordance with an example embodiment of inventive concepts.

FIG. 19 is a circuit diagram showing an input/output buffer 100 circuit included in the structure of tile shown in FIG. 17 in accordance with an example embodiment of inventive concepts.

Referring to FIG. 19, the input/output buffer circuit 100c may include a first buffer circuit 110b and a second buffer circuit 130b.

The first buffer circuit 110b receives an address ADD, a command CMD and input data DQ1 through a micro channel CH0, and inputs the input data DQ1 to the first sub memory array 200 in FIG. 17 and/or the second sub memory array 300 in FIG. 17 based on the address ADD1 and the command CMD1, or outputs data from the first sub memory array 200 and/or the second sub memory array 300 through the micro channel CH0. The second buffer circuit 130b receives an address ADD2, a command CMD2 and input data DQ2 through a micro channel CH2 in response to the anti-fuse output signal FOUT, and inputs the input data DQ1 to the first sub memory array 200 and/or the second sub memory array 300 based on the address ADD2 and the command CMD2, or outputs data from the first sub memory array 200 and/or the second sub memory array 300 through the micro channel CH2.

In the example of FIG. 19, the address, the command and the data received through the micro channels CH0 and CH2 may be the same or different. Further, the data input to the sub memory arrays 200 and 300 may be different from the data output from the sub memory arrays 200 and 300. Further, in the example of FIG. 19, data input to or output from the sub memory arrays 200 and 300 may have 128 bits.

The first buffer circuit 110b and the second buffer circuit 130b may have the same structure as those of FIG. 6 except an address/command decoder 113' does not receive the selecting code SEL_CODE. In the example of FIG. 19, the anti-fuse output signal FOUT may be applied to the second address/command decoder 133.

Figure 20:
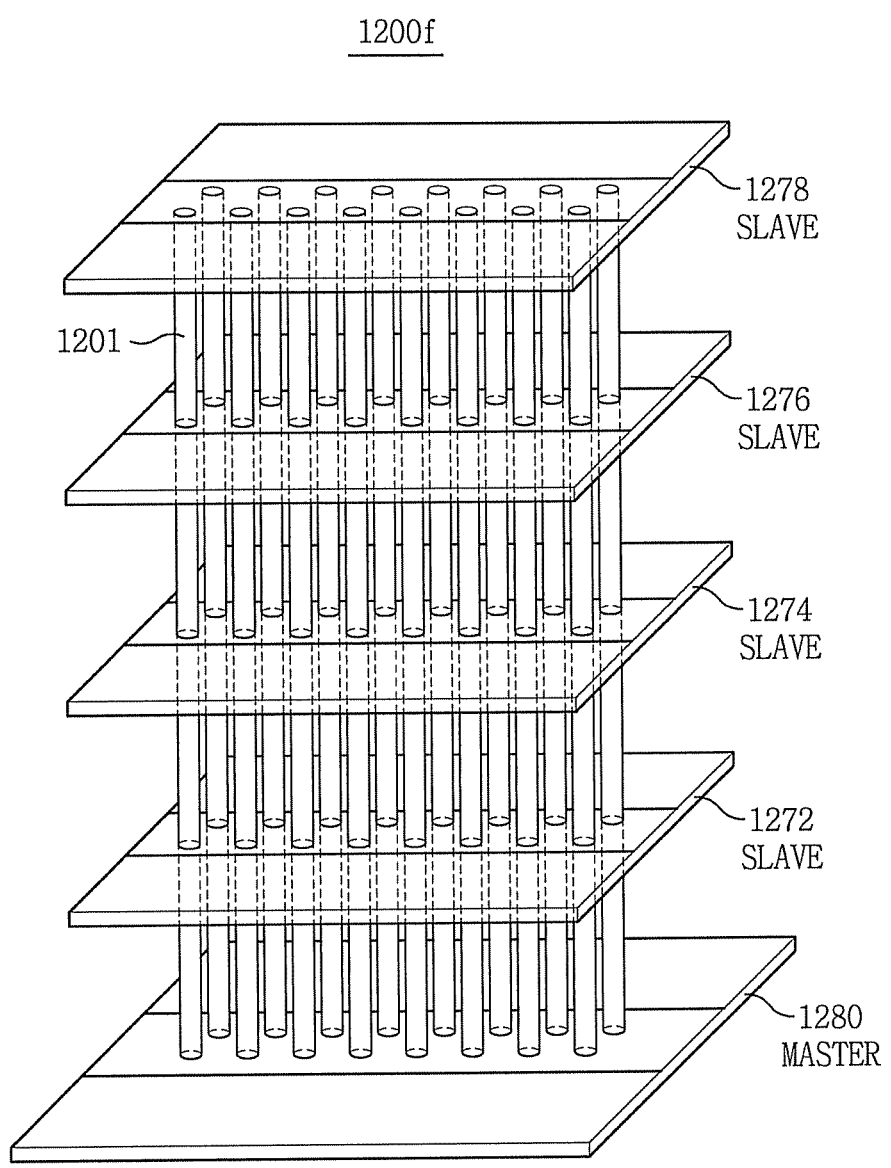
FIG. 20 is a schematic perspective view showing a three-dimensional structure of the stacked memory device in FIG. 1 in accordance with still another example embodiment of inventive concepts.

FIG. 20 is a schematic perspective view showing a three-dimensional structure of the stacked memory device in FIG. 1 in accordance with still another example embodiment of inventive concepts.

Referring to FIG. 20, the stacked memory device 1200f may include a master chip 1280 including an input/output buffer circuit, and at least one of slave chips 1272, 1274, 1276 and 1278 including a memory array and stacked above the master chip 1280.

The input/output buffer circuit included in the master chip 1280 may select a micro channel or micro channels through which the memory array included in each of the slave chips 1272, 1274, 1276 and 1278 in response to a selecting code, and may transfer an address, a command and input data to each of the slave chips 1272, 1274, 1276 and 1278 through the selected micro channel or the selected micro channels. Further, the input/output buffer circuit may output data from the memory array included in each of the slave chips to the outside through the selected micro channel or selected micro channels.

The stacked memory device 1200f shown in FIG. 20 may include at least one memory banks comprised of sub memory arrays included in slave chips different from each other among the slave chips.

All or part of the circuit of FIG. 6 may be included in the master chip of FIG. 20, and a function of one tile may be implemented by both the master chip 1280 and the slave chips 1272 to 1278. The implementation of one tile may not be limited to the master chip 1280 and one slave chip, but may be done using the master 1280 and a plurality of slave chips.

Figure 21:
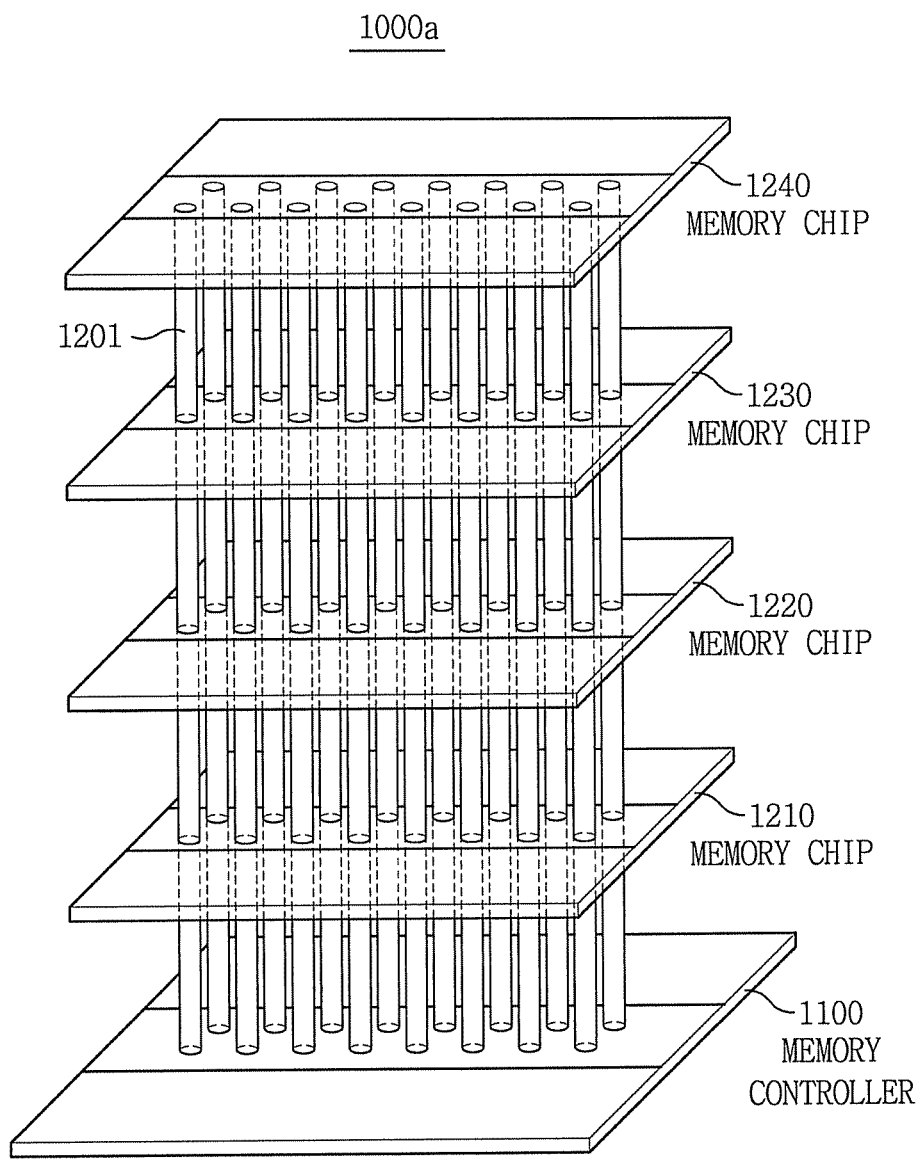
FIG. 21 is a schematic perspective view showing a memory system including both a stacked memory device and a memory controller in accordance with another example embodiment of inventive concepts.

FIG. 21 is a schematic perspective view showing a memory system 1000a including both a stacked memory device and a memory controller in accordance with another example embodiment of inventive concepts.

Referring to FIG. 21, the memory system 1000a includes a memory controller 1100 and a stacked memory device including memory chips 1210, 1220, 1230 and 1240.

The memory controller 1100 generates an address and a command. The stacked memory device operates based on the address and the command, and may adjust the number of micro channels for accessing a memory array included in each of the stacked memory chips.

As described above, the stacked memory device in accordance with example embodiments of inventive concepts may adjust the number of micro channels for accessing a memory array included in each of the stacked memory chips. Further, the stacked memory device having a tile structure in accordance with example embodiments of inventive concepts may adjust memory capacity and the number of memory banks accessed by each of the micro channels.

In the above, a stacked memory device including four memory chips and a stacked memory device including two memory chips are shown as examples, but example embodiments of inventive concepts may be applicable to a stacked memory device including an arbitrary number of memory chips.

In accordance with example embodiments of inventive concepts, memory chips and a stacked memory device including the memory chips may adjust the number of micro channels for accessing a memory array included in each of the stacked memory chips. Therefore, the stacked memory device may adjust memory capacity and the number of memory banks accessed by each of the micro channels.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included in the scope of inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included in the scope of the appended claims.

What is claimed is:

1. A stacked memory device comprising:
a plurality of stacked memory chips, each of the memory chips including a memory array;
a plurality of through silicon vias (TSVs) operatively connected to the plurality of stacked memory chips;
micro channels configured to access the memory arrays; and
at least one circuit in each memory chip, the at least one circuit configured to vary a number of the micro channels accessing the memory array.

2. The stacked memory device according to claim 1, wherein the micro channels include the plurality of TSVs.

3. The stacked memory device according to claim 1, wherein the circuit is configured to vary a memory capacity accessed by each of the micro channels.

4. The stacked memory device according to claim 1, wherein the circuit is configured to vary a number of memory banks accessed by each of the micro channels.

5. The stacked memory device according to claim 1, wherein each of the plurality of memory chips includes a plurality of the at least one circuit, wherein each of the at least one circuit further includes:
a first sub memory array;
a second sub memory array; and
an input/output buffer circuit configured to select at least one micro channel in response to a selecting code,
the input/output buffer circuit configured to receive input data through the at least one selected micro channel and input to at least one of the first sub memory array and the second sub memory array, or output data from at least one of the first sub memory array and the second sub memory array through the at least one selected micro channel.

6. The stacked memory device according to claim 5, wherein the input/output buffer circuit comprises:
a first buffer circuit configured to,
receive a first address, a first command and first input data through a first micro channel in response to the selecting code, and
input the first input data to at least one of the first sub memory array and the second sub memory array based on the first address and the first command, or output first output data from at least one of the first sub memory array and the second sub memory array through the first micro channel; and
a second buffer circuit configured to,
receive a second address, a second command and second input data through a second micro channel in response to the selecting code, and
input the second input data to at least one of the first sub memory array and the second sub memory array based on the second address and the second command, or output second output data from at least one of the first sub memory array and the second sub memory array through the second micro channel.

7. The stacked memory device according to claim 6, wherein the first buffer circuit comprises:
a first address/command input circuit configured to receive the first address, the first command and the first input data through the first micro channel;
a first address/command decoder configured to decode the first address and the first command in response to the selecting code;
a first data input/output circuit configured to receive the first input data, or output the first output data in response to the decoded first address and the decoded first command; and
a first multiplexer configured to input the first input data to at least one the first sub memory array and the second sub memory array in response to the decoded first address and the decoded first command, or receive the first output data from at least one of the first sub memory array and the second sub memory array to provide to the first data input/output circuit.

8. The stacked memory device according to claim 7, wherein the second buffer circuit comprises:
a second address/command input circuit configured to receive the second address, the second command and the second input data through the second micro channel;
a second address/command decoder configured to decode the second address and the second command in response to the selecting code;
a second data input/output circuit configured to receive the second input data, or outputting the second output data in response to the decoded second address and the decoded second command; and
a second multiplexer configured to input the second input data to at least one of the first sub memory array and the second sub memory array in response to the decoded second address and the decoded second command, or receive the second output data from at least one of the first sub memory array and the second sub memory array to provide to the second data input/output circuit.

9. The stacked memory device according to claim 7, wherein the second buffer circuit comprises:
a second address/command input circuit configured to receive the second address, the second command and the second input data through the second micro channel;
a second address/command decoder configured to decode the second address and the second command in response to the selecting code;
a second multiplexer configured to select one of an output signal of the first address/command decoder and an output signal of the second address/command decoder in response to the selecting code;
a second data input/output circuit configured to operate in response to the selecting code and receive the second input data, or output the second output data in response to an output signal of the second multiplexer; and
a third multiplexer configured to input the second input data to at least one of the first sub memory array and the second sub memory array in response to the output signal of the second multiplexer, or receive the second output data from at least one of the first sub memory array and the second sub memory array to provide to the second data input/output circuit.

10. The stacked memory device according to claim 1, comprising:
a first memory chip;
a second memory chip stacked above the first memory chip;
a third memory chip stacked above the second memory chip; and
a fourth memory chip stacked above the third memory chip,
wherein the fourth memory chip is accessed by a first micro channel, a fifth micro channel, a ninth micro channel and a thirteenth micro channel, the third memory chip is accessed by a second micro channel, a sixth micro channel, a tenth micro channel and a fourteenth micro channel, the second memory chip is accessed by a third micro channel, a seventh micro channel, an eleventh micro channel and a fifteenth micro channel, and the first memory chip is accessed by a fourth micro channel, an eighth micro channel, a twelfth micro channel and a sixteenth micro channel.

11. The stacked memory device according to claim 1, comprising:
a first memory chip; and
a second memory chip stacked above the first memory chip,
wherein the second memory chip is accessed by a first micro channel, a third micro channel, a fifth micro channel, a seventh micro channel, a ninth micro channel, an eleventh micro channel, a thirteenth micro channel and a fifteenth micro channel, and the first memory chip is accessed by a second micro channel, a fourth micro channel, a sixth micro channel, an eighth micro channel, a tenth micro channel, a twelfth micro channel, a fourteenth micro channel and a sixteenth micro channel.

12. The stacked memory device according to claim 1, comprising:
a master chip including an input/output buffer circuit; and
at least one slave chip including a memory array and stacked above the master chip.

13. The stacked memory device according to claim 12, wherein the input/output buffer circuit is configured to select at least one micro channel in the memory array included in each of the at least one slave chip in response to a selecting code, and
the input/output buffer is configured to transfer an address, a command and input data to each of the at least one slave chip through the selected at least one micro channel, or output data from the memory array included in each of the at least one slave chip the selected at least one micro channel.

14. The stacked memory device according to claim 12, wherein the at least one slave chip includes a plurality of slave chips, the stacked memory device comprising:
at least one memory bank including sub memory arrays included in the slave chips, the at least one memory bank in each slave chip being different.

15. A memory system comprising:
a memory controller configured to generate an address and a command; and
a stacked memory device configured to operate based on the address and the command, the memory device includes,
a plurality of stacked memory chips, each of the memory chips including a memory array,
a plurality of through silicon vias (TSVs) operatively connected to all of the plurality of stacked memory chips,
micro channels configured to access the memory arrays, and
at least one circuit in each memory chip, the at least one circuit configured to vary a number of the micro channels accessing the memory array.

16. A memory system comprising:
a plurality of memory chips, each of the plurality of memory chips including,
a plurality of circuit blocks, each circuit block being coupled to a plurality of micro channels, each micro channel coupled to the plurality of memory chips, each circuit block including,
a first memory array configured to store information based on data received from at least one of the plurality of micro channels, each circuit block configured to vary a number of the micro channels accessing the first memory array.

17. The memory system of claim 16, wherein each circuit block further includes,
a buffer coupled to the at least one micro channel and configured to send data to the first memory array based on the data received from the at least one micro channel.

18. The memory system of claim 17, wherein each circuit block further includes, a second memory array configured to store information based on data received from the at least one micro channel.

19. The memory system of claim 18, wherein each circuit block is configured to receive address information and command information, each circuit block is further configured to output data to at least one of the first memory array and the second memory array based on the address information and command information.

20. The memory system of claim 18, wherein each circuit block is configured to receive address information and command information, each circuit block is further configured to receive data from at least one of the first memory array and the second memory array based on the address information and command information.

* * * * *